(12) United States Patent
Vergnes et al.

(10) Patent No.: US 7,701,802 B2
(45) Date of Patent: Apr. 20, 2010

(54) CIRCUITS TO DELAY A SIGNAL FROM A MEMORY DEVICE

(75) Inventors: Alain Vergnes, Trets (FR); Eric Matullk, Meyreull (FR); Frederic Schumacher, Aix En Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/245,473

(22) Filed: Oct. 3, 2008

(65) Prior Publication Data
US 2009/0033391 A1 Feb. 5, 2009

Related U.S. Application Data

(63) Continuation of application No. 11/466,327, filed on Aug. 22, 2006, now Pat. No. 7,433,262, which is a continuation-in-part of application No. 11/466,311, filed on Aug. 22, 2006, now Pat. No. 7,539,078.

(51) Int. Cl.
 *G11C 8/00* (2006.01)
(52) U.S. Cl. .............................. 365/233.1; 365/189.07; 365/191; 365/233.13
(58) Field of Classification Search .................. 365/193, 365/194, 233.1, 233.11, 233.13
See application file for complete search history.

(56) References Cited

U.S. PATENT DOCUMENTS

| 4,503,494 A | 3/1985 | Hamilton et al. |
| 5,656,958 A | 8/1997 | Albert et al. |
| 5,703,915 A | 12/1997 | Vergnes et al. |
| 5,977,805 A | 11/1999 | Vergnes et al. |
| 6,043,694 A | 3/2000 | Dortu |

(Continued)

FOREIGN PATENT DOCUMENTS

WO WO-2008024659 A2 2/2008

(Continued)

OTHER PUBLICATIONS

"U.S. Appl. No. 11/466,311, Non Final Office Action mailed Aug. 22, 2007", 12 pgs.

(Continued)

*Primary Examiner*—Son Dinh
*Assistant Examiner*—Harry W Byrne
(74) *Attorney, Agent, or Firm*—Schwegman, Lundberg & Woessner, P.A.

(57) ABSTRACT

A method for delaying a control signal, includes receiving a clock signal, determining a number of delay elements required to generate a first delay equal to a target amount of the period of the clock signal, receiving a data signal having an edge generated at the same time as an edge of the control signal, determining a fraction number equal to the number of delay elements needed to generate a second delay for the data signal or the control signal to align their edges, divided by the number of cascaded delay elements necessary to provide a delay equal to the target amount of the period of the clock signal, multiplied by the number of delay elements to generate the first delay, and delaying the control signal by the number of cascaded delay elements to realize said first delay altered by the fraction number of delay elements.

26 Claims, 14 Drawing Sheets

U.S. PATENT DOCUMENTS

| | | | |
|---|---|---|---|
| 6,222,792 B1 | 4/2001 | Hanzawa et al. | |
| 6,396,322 B1 | 5/2002 | Kim et al. | |
| 6,417,715 B2 | 7/2002 | Hamamoto et al. | |
| 6,480,439 B2 | 11/2002 | Tokutome et al. | |
| 6,581,017 B2 | 6/2003 | Zumkehr | |
| 6,646,929 B1 | 11/2003 | Moss et al. | |
| 6,677,791 B2 | 1/2004 | Okuda et al. | |
| 6,721,232 B2 | 4/2004 | Kashiwazaki | |
| 6,741,522 B1 | 5/2004 | Lin | |
| 6,909,315 B2 | 6/2005 | Carnevale et al. | |
| 6,928,128 B1 | 8/2005 | Sidiropoulos | |
| 6,930,949 B2 | 8/2005 | Schaefer | |
| 6,940,768 B2 | 9/2005 | Dahlberg et al. | |
| 6,944,070 B1 | 9/2005 | Proebsting et al. | |
| 6,954,866 B2 | 10/2005 | Vergnes | |
| 6,982,579 B2 | 1/2006 | Lee | |
| 7,433,262 B2 | 10/2008 | Trets et al. | |
| 7,539,078 B2 | 5/2009 | Matulik et al. | |
| 2003/0200518 A1* | 10/2003 | Saeki | 716/6 |
| 2003/0204763 A1* | 10/2003 | Moss et al. | 713/400 |
| 2004/0123207 A1 | 6/2004 | Zumkehr et al. | |
| 2005/0027471 A1 | 2/2005 | Vergnes | |
| 2005/0047192 A1* | 3/2005 | Matsui et al. | 365/145 |
| 2005/0050375 A1 | 3/2005 | Novak et al. | |
| 2005/0089060 A1 | 4/2005 | Vergnes | |
| 2005/0165996 A1 | 7/2005 | Vergnes et al. | |
| 2005/0219888 A1 | 10/2005 | Kwon et al. | |
| 2006/0224848 A1 | 10/2006 | Matulik et al. | |
| 2006/0236007 A1 | 10/2006 | Matulik | |
| 2008/0123445 A1 | 5/2008 | Vergnes et al. | |
| 2009/0077409 A1 | 3/2009 | Matulik et al. | |
| 2009/0238016 A1 | 9/2009 | Matulik et al. | |

FOREIGN PATENT DOCUMENTS

| | | |
|---|---|---|
| WO | WO-2008024659 A3 | 2/2008 |
| WO | WO-2008024680 A2 | 2/2008 |
| WO | WO-2008024680 A3 | 2/2008 |

OTHER PUBLICATIONS

"U.S. Appl. No. 11/466,311, Response filed Aug. 20, 2008 to Non-Final Office Action mailed Aug. 22, 2007", 14 pages.

"U.S. Appl. No. 11/466,311, Notice of Allowance mailed Jan.15, 2009", 9 pgs.

"U.S. Appl. No. 11/466,327, Non Final Office Action mailed Aug. 22, 2007", 6 pgs.

"U.S. Appl. No. 11/466,327, Response filed Dec. 26, 2007 to Non Final Office Action mailed Aug. 22, 2007", 13 pgs.

"International Application Serial No. PCT/US2007/076204, International Preliminary Examination Report mailed Oct. 15, 2008", p. 416, 8 pgs.

"The D-Type (delay) Flip-Flop", Physics 107 course taught at the University of Sheffield, URL — http://web.archive.org/web/20031031215632/http://www.shef.ac.uk/physics/teaching/phy107/dff.html(3 of 3)Aug. 17, 2007 8:52:01 Am, (Oct. 31, 2003), 3 pgs.

"U.S. Appl. No. 11/466,327, Notice of Allowance mailed May 16, 2008", 8 pgs.

"International Application Serial No. PCT/US2007/076204, Search Report and Written Opinion mailed May 15, 2008", 10 pgs.

Farjad-Rad, R., et al., "A low-power Multiplying DLL for Low-Jitter Multigigahertz Clock Generation in Highly Integrated Digital IChips", IEEE Journal of Solid-state circuits, vol. 37(12), (Dec. 20, 2002), 1804-1812.

"International Application Serial No. PCT/US07/76024, International Search Report mailed Mar. 12, 2008", 1 pg.

"International Application Serial No. PCT/US07/76024, Written Opinion mailed Mar. 12, 2008", 4 pgs.

* cited by examiner

US 7,701,802 B2

CIRCUITS TO DELAY A SIGNAL FROM A MEMORY DEVICE

RELATED APPLICATIONS

This application is a continuation of U.S. patent application Ser. No. 11/466,327, filed Aug. 22, 2006 now U.S. Pat. No. 7,433,262, which is a continuation-in-part of U.S. patent application Ser. No. 11/466,311, filed Aug. 22, 2006.

BACKGROUND OF THE INVENTION

1. Field of the Invention

The present invention relates to dual-data-rate dynamic-random-access-memory (DDR-SDRAM) devices. More particularly, the present invention relates to circuits to delay the "DQS" signal from a DDR-SDRAM memory device to capture data, the "DQS" signal and the data being generated simultaneously by the memory device, the circuits including a fine delay tuning capability.

2. The Prior Art

DDR-SDRAM devices can transfer data twice as fast as single-data-rate SDRAM memory devices (SDR-SDRAM). This is because DDR-SDRAM devices can send and receive signals twice per clock cycle. This feature increases the complexity of writing data to and reading data from the DDR-SDRAM device since the valid-data window is narrower than in SDR-SDRAM devices.

Referring now to FIGS. 1A and 1B, a timing diagram illustrates the valid data time windows for SDR-SDRAM devices (FIG. 1A) and DDR-SDRAM devices (FIG. 1B) with relation to the clock timing. From FIG. 1A, it may be seen that there is a single valid data window for each complete cycle of the SDR-SDRAM clock. From FIG. 1B, it may be seen that there are two valid data windows for each DDR-SDRAM clock cycle.

In an application system, for example a microcontroller circuit connected to DDR-SDRAM devices on a printed circuit board, the signal DQS is a bidirectional control signal transmitted by the DDR-SDRAM devices during read operations and by the memory controller during write operations. The memory controller may be part of a microcontroller integrated circuit. For DDR device circuitry optimization, the DQS signal is provided edge-aligned with data for read operations and should be center-aligned with data for write operations. The DQS signal and its relationship to the valid data windows in a typical read operation, is shown in FIG. 3 and the DQS signal and its relationship to the valid data windows in a typical write operation, is shown in FIG. 2.

To write data to DDR-SDRAM devices without increasing the complexity of the DDR-SDRAM controller and to guaranty that the signal is center-aligned with data, it is possible to use the falling edge of a clock signal running at twice the frequency of the clock that drives the DDR-SDRAM devices. This aspect of operation of a DDR-SDRAM device is shown with reference to FIG. 2, in which waveforms illustrate that, for a write access from a DDR-SDRAM device, the rising and falling edges of a DDR-SDRAM DQS signal are center aligned with the valid data. The DDR-SDRAM controller generates signals with such phase relationship.

As also shown in FIG. 3, if delayed with an appropriate time increment, the delayed DQS signal is aligned with the center of the valid data window, the DQS signal can be used as a sample and hold signal which makes a simple, safe circuitry to capture data from DDR-SDRAM device.

During read operation, the DQS signal is edge-aligned with data, the controller delays the DQS signal by a period of time corresponding to about ¼ of the DDR device clock period to allow the alignment of the delayed DQS signal with the center of the valid data window. Under this condition, the data from the DDR device can be properly sampled because the hold/setup time margins are optimal (middle of data valid window, 321, 322, 331, 332). Of course, the delay must be stable.

A simple delay circuitry having DQS as its input and formed from a delay line of cascaded basic cell elements such as buffers or inverters does not guaranty a stable delay because basic element intrinsic delay depends on de-rating factors such process, voltage, and temperature variations.

BRIEF DESCRIPTION OF THE INVENTION

A method for delaying an input control signal, comprises receiving an input clock signal; determining a number of cascaded delay elements required to form a first delay equal to a target amount of the period of the input clock signal; receiving an input data signal having an edge generated with an edge of the input control signal; determining the number of cascaded delay elements needed to form a second delay for one of the input data signal and the input control signal by an amount necessary to align the edge of the input data signal with the edge of the input control signal; and delaying the input control signal by an amount of time equal to the first delay altered by the second delay such that the edge of the input control signal is delayed from the edge of the input data signal by the target amount.

A circuit according to the present invention for delaying an input control signal comprises a circuit for receiving an input clock signal and determining a number of cascaded delay elements required to form a first delay equal to a target amount of the period of the input clock signal; a circuit for receiving an input data signal having an edge generated with an edge of the input control signal and determining the number of cascaded delay elements needed to form a second delay for one of the input data signal and the input control signal by an amount necessary to align the edge of the input data signal with the edge of the input control signal; and a circuit for delaying the input control signal by an amount of time equal to the first delay altered by the second delay such that the edge of the input control signal is delayed from the edge of the input data signal by the target amount.

During read operation, the DQS signal is edge-aligned with data. According to the present invention, the controller must delay the DQS signal by a theoretical period of time corresponding to ¼ of the DDR device clock period. Due to different derating factors, the DQS and DATA signals are not 100% edge aligned in real life operations and therefore the delay value must be adjustable around ¼ of the DDR device clock period. Under this condition, the data from the DDR device can be properly sampled because the hold/setup time margins are optimally located in the real middle of the data-valid window.

This logic is a kind of delay locked loop acting as master circuitry to calculate the number of cascaded basic elements required to produce a known delay and keep it stable with respect to conditions such as process variations, voltage, and temperature. The master circuitry drives a slave delay circuit that applies the required and stable delay to the DQS signal. The master circuitry (DLL) allows determination of a stable delay (about ¼ of a clock period) regardless of the derating factors (e.g., process, voltage and temperature). The time reference entered into the master circuitry is a clock signal whose frequency is a fraction of the DDR device clock frequency. The DQS and data phases relative to the DDR device clock may vary from one printed circuit board to another due to their different topologies and differences in internal circuitry topologies of the memory devices. The DQS phase may also vary due to derating factors such voltage drops.

The slave circuitry delays the DQS signal by the stable delay (about ¼ DDR clock period). Therefore the output of the slave circuitry can be used as data sampling command. The DLL circuitry determines the number of basic elements such as buffers or inverters to be cascaded to delay the DQS signal by a given amount of time (about ¼ of the DDR clock). The number of delay elements may be modified/adjusted on the fly to obtain the stable delay.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 4:
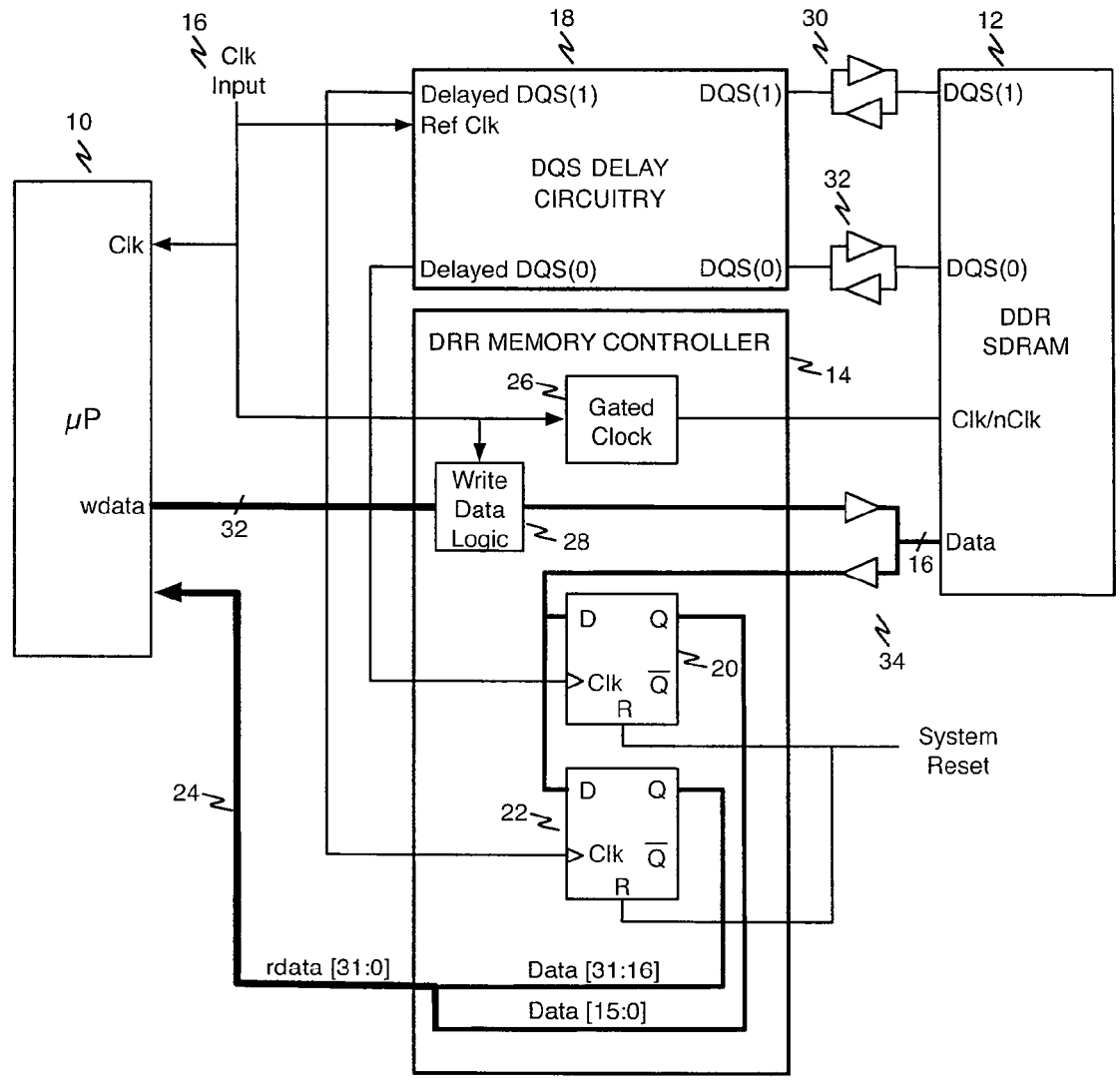
FIG. 4 is a diagram illustrating a typical application environment in which a microcontroller is shown driving a DDR-SDRAM device.

Referring now to FIG. 4, a block diagram illustrates a typical environment in which the present invention may be employed. FIG. 4 shows a system including a microcontroller 10 connected to a DDR-SDRAM device 12 through a DDR memory controller 14. An input clock signal, shown at reference numeral 16, provides a clock reference signal to DQS delay circuitry 18. The function of DQS delay circuitry 18 is to delay the DQS(0) and DQS(1) signals from DDR-SDRAM device 12 to produce a delayed DQS(0) and a delayed DQS(1) signal to control reading data from DDR-SDRAM device 12. It is to a DQS delay circuitry 18 that the present invention is directed.

As may be seen from an examination of FIG. 4, the delayed DQS(0) and delayed DQS(1) signals are used to clock D-flip-flops 20 and 22, respectively. D-flip-flops 20 and 22 are used to latch the lower-order and upper-order data bits read from DDR-SDRAM device 12 and presented to microprocessor 10 on read data bus 24. In addition, gated clock 26 and write-data logic 28 in DDR memory controller 14 generate the signals necessary to write data from microprocessor 10 into DDR-SDRAM device 12. As will be appreciated by persons of ordinary skill in the art, bidirectional buffers 30 and 32 are interposed between DDR-SDRAM device 12 and DQS delay circuitry 18 and bi-directional buffer 34 is interposed between DDR-SDRAM device 12 and DDR memory controller 14. These buffers are controlled as known in the art to pass data in the proper direction for read and write operations by conventional circuitry (not shown).

To make the DQS signal delay stable, a programmable delay line is used and tuned with regard to variations in the derating factor. This tuning is automatically performed by a locked loop circuit (master). The respective DQS and data phases may also vary from one printed circuit board to another due to different printed circuit board topologies and also to internal discrepancies of the DDR memory device circuits, resulting in the necessity to tune the theoretical delay applied to the DQS signal. The phase of the DQS signal may also vary due to de-rating factors such internal or external voltage drops. Therefore a programmable delay line more complex than a simple delay line is used in the present invention. Such a programmable delay line employs a programmable number of basic delay units as will be disclosed herein. Independent master circuitry is used to keep track of the derating variations to select, in real-time, the number of basic delay elements used in the programmable delay line to provide a given delay for the DQS signal input. The independent master circuitry is provided with a stable delay reference and locks on to the stable delay reference using a number of basic delay cells identical to the programmable delay line used to delay the DQS signal input. The locked system ensures tracking variations in the derating factor.

For design convenience and simplicity, the stable time reference entered into the master circuitry is the clock signal of the DDR-SDRAM memory controller or a clock signal having a frequency which is a sub-multiple (divided by 2, etc.) of the frequency of the memory controller to make the DQS delay circuitry more simple to design.

The slave circuitry receives the DQS signal as input and delays it by the stable delay (about ¼ DDR clock period, subject to fine tuning to match DQS and data phase variations. Therefore the output of the slave circuitry driven by the master circuitry can be used as data sampling command.

Figure 5:
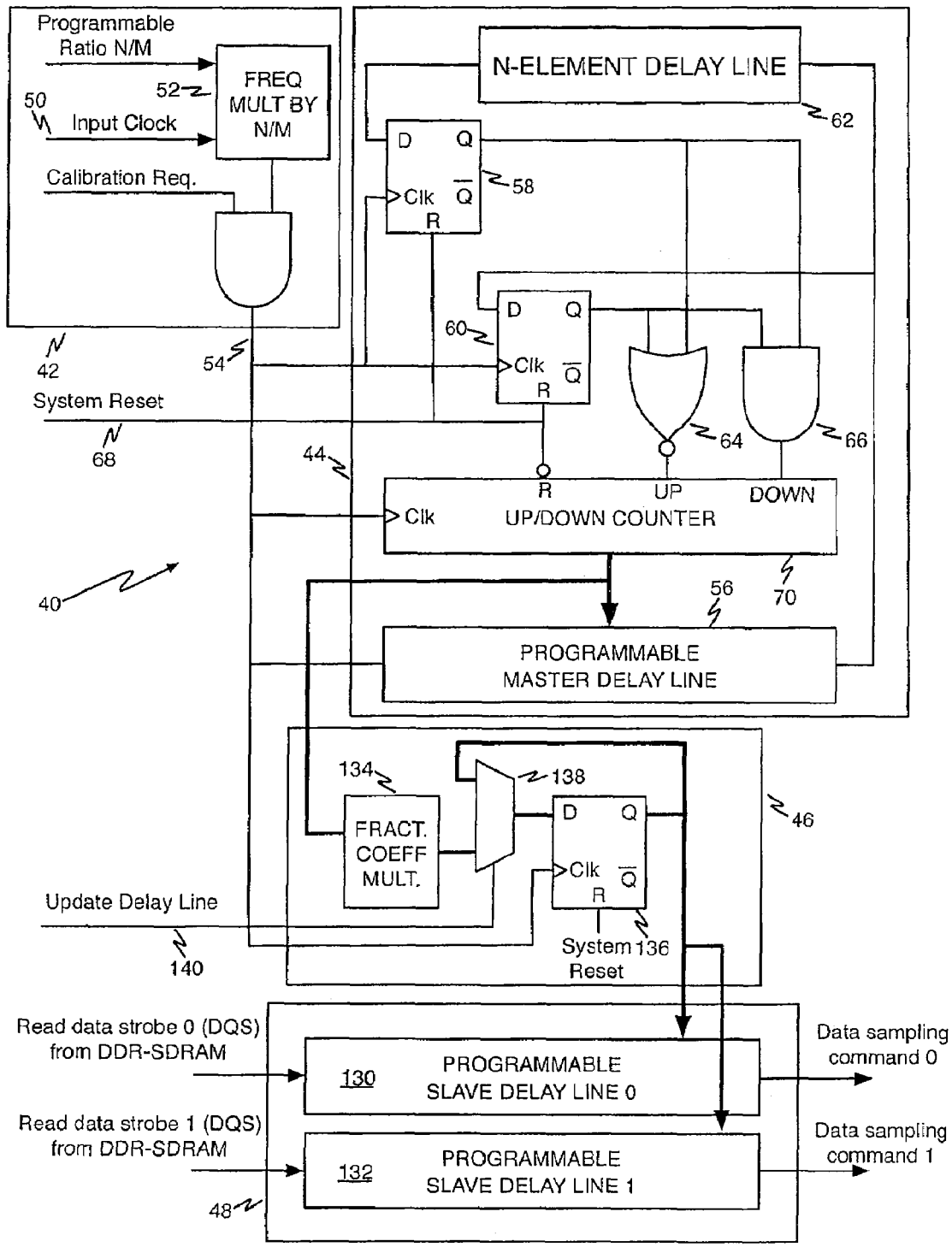
FIG. 5 is a block diagram illustrating a circuit according to the present invention for producing a DQS signal having a programmable delay.

Referring now to FIG. 5, a simplified schematic diagram shows an illustrative example of DQS Delay circuitry 40 that provides the aforementioned features according to the present invention. A simplified schematic includes blocks 42, 44, 46, and 48. The reference delay will be provided by block 42, then master locked loop circuitry 44 will determine the number of basic delay elements to cascade to obtain the reference delay. This number of delay elements will be converted in block 46 to get the final number of basic delay elements to delay the DQS signals by means of slave delay lines 48.

Block 42 allows obtaining a programmable reference delay by employing circuitry that multiplies the input frequency on line 50 by the programmable ratio N/M in multiplier 52, whose output has a frequency value equal to $[(N/M)*F_{input}]$, where $f_{input}$ is the input frequency on line 50. The output 54 of block 42 is the system clock of the DQS delay circuitry 40 and will act as a reference signal/delay. For design convenience and simplicity, the stable time reference entered into the master circuitry may be the clock signal of the DDR-SDRAM memory controller divided by 2, therefore N=1, M=2.

This programmable value allows modification of the optimal data sampling point. The theoretical value of the optimal data sampling point is ¼ of the DDR-SDRAM clock period, but due to different printed circuit boards on which data and DQS signals are routed with different wire lengths and/or capacitances, the terminal points of these signals may be differently phased. Therefore, the optimal sampling point will be nominally about ¼ of the clock period but may end up to be a little bit more or less. As these conditions can vary from one printed circuit board to another, it is important to provide the capability to tune the sampling point through the user interface of the DDR-SDRAM controller.

Different methods exist to generate a programmable delay, and the module 40 of FIG. 5 is one example. The fractional coefficient multiplier can use a phase-locked loop (PLL) and two simple clock dividers to get a fractional divider as will be shown with reference to FIG. 6.

For the descriptions of next modules, it is assumed that module 42 provides an output clock period on signal line 54 being twice the input clock period provided to the DDR-SDRAM device (i.e. if the DDR-SDRAM is clocked at 100 MHz, the frequency at signal line 54 is 50 MHz). This will make the reference delay stable by keeping it independent of the variations of duty cycle on signal 50. Therefore, having no capability of adjustment on this side, there is a need to get this capability of adjustment somewhere. The present invention provides this fine adjustment.

Block 44 contains the circuitry that locks on the reference delay provided by module 42. It allows determination of the number of basic delay elements of a delay line 56 to obtain a delay which is a fraction of the system clock period.

The number of delay elements determined by block 44 will be a known fraction of the number of elements required to delay the DQS signal from DDR-SDRAM devices. The delay line used in module 44 is designed with the same basic delay elements as the one that will be used in the slave delay line to delay the DQS signal.

In the following example, the module 44 is designed in such a way that it locks on half of a system clock period. This leads to a simplified circuit architecture to reach the lock state from initial or reset state or from lock to lock state (due to a derating factor variation).

As in all locked systems, the architecture comprises a phase detector circuit to provide the information necessary to add or remove basic delay elements in the programmable delay line 56 to match the reference delay provided by stable clock signal 54.

In the example shown in FIG. 5, the phase detector circuit includes D-flip-flops 58 and 60, delay line elements 62 including a limited number of basic delay elements (buffers or an even number of inverters), a NOR gate 64 and an AND gate 66. The circuit is driven by clock input 54, and uses the output of delay line 62 and the output of the programmable delay line 56 as a feedback clock.

When system reset is asserted on line 68, the D-flip-flops 58 and 60 are cleared, the programmable master delay line provides a feedback clock at the output of master programmable delay line 56 delayed by a single basic delay element because the up/down counter 70 is set accordingly from the outputs of NOR gate 64 and an AND gate 66.

Figure 8A:
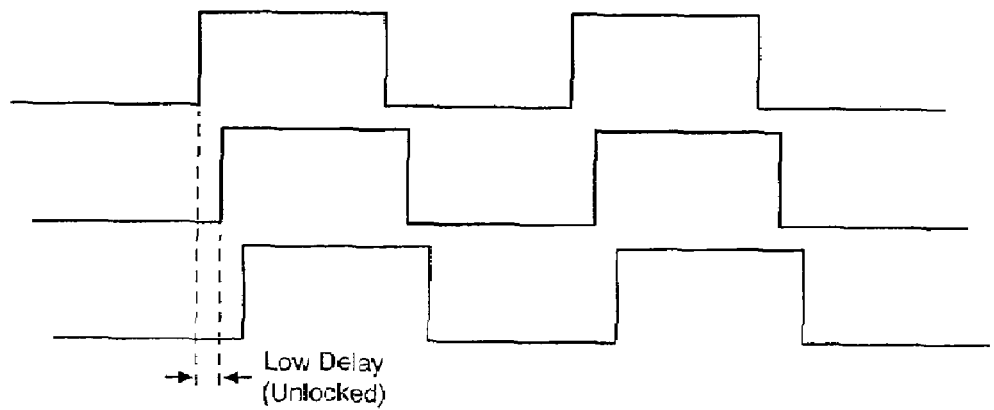
FIGS. 8A through 8C are timing diagrams showing the locked and two unlocked conditions for the circuit of FIG. 5.

After de-assertion of system reset on line 68, the D-flip-flops 58 and 60 start sampling logical "0" (the low portion of the waveform at the output of master programmable delay line 56). When the outputs of both D-flip-flops are cleared, the 2-input NOR gate 64 provides a logical 1 at the "UP" input of up/down counter 70 to indicate that the phase detector 44 is unlocked and requires more basic delay elements to be included in the master programmable delay line to reach the lock state. The 2-input AND gate 66 drives the "DOWN" input of the up/down counter 70 with a logical "0" to indicate that there is no need to remove delay elements in the programmable delay line 56. An example of this state is shown in FIG. 8A.

The up/down counter 70 modifies its output to instruct master programmable delay line 56 to add more delay. The programmable delay line increases its internal delay accordingly by selecting 1 more basic delay. The phase detector module 44 is still in its unlocked state.

Figure 8B:
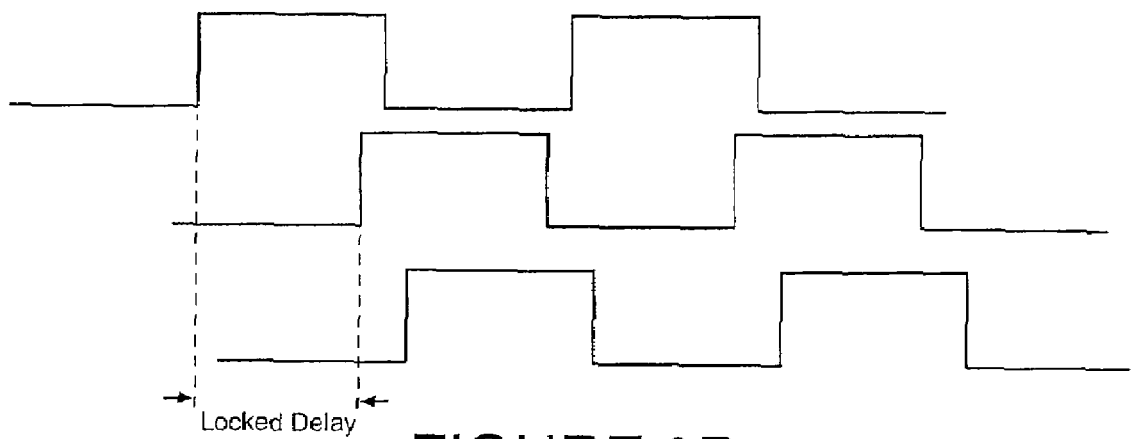
Figure 8C:
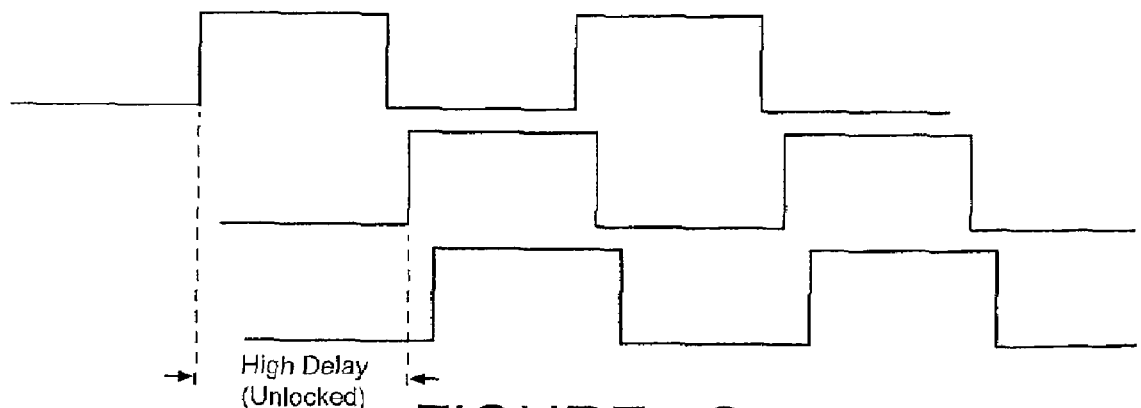

If the delay becomes greater than the reference delay provided by the clock period of system clock at its output 54, both D-flip-flops 58 and 60 sample a logical "1." The 2-inputs NOR gate 64 returns logical "0" to the "UP" input of up/down counter 70 and the 2-input AND gate 66 provides a logical "1" to the "DOWN" input of up/down counter 70. Under these conditions, up/down counter 70 modifies the value provided on its output to instruct the master programmable delay line 56 to remove one basic delay element. The master programmable delay line decreases its internal delay accordingly. The phase detector 44 is still in its unlocked phase. An example of this state is shown in FIG. 8C.

When the programmable delay line 56 delays the system clock on signal line 54 by half the system clock period (locked state), D-flip-flop 58 samples a logical "1" whereas D-flip-flop 60 samples a logical "0." This difference of sampled values is possible due to the presence of delay line 62 in the path of the data input of D-flip-flop 58.

Delay line 62 allows locating the falling edge of the delayed feedback clock at the output of delay line 62 to a time after the rising edge of system clock on line 54 and locating the falling edge of the feedback clock at the input delay line 62 prior to the rising edge of the system clock on line 54. In this case both NOR gate 64 and AND gate 66 provide logical "0" to the "UP" and "DOWN" inputs of up/down counter 70. The output of up/down counter 70 does not change, indicating that the phase error provided by the phase detector is zero and the phase detector 44 is locked. An example of this state is shown in FIG. 8B. If the propagation delay of phase detector 44 is greater than the higher value of the metastable period among D-flip-flops 58 and 60 plus the minimum delay in the programmable delay line 62, the phase detector will stay in a locked state without metastable behavior of D-flip-flops 58 and 60. Metastable states will occur in transient phases.

The delay line 62 can be designed with basic delay elements such classical inverters or buffers. There is no need for more complex delay elements as will be disclosed with reference to the master programmable delay line 56.

The propagation delay between the input of delay line 62 and its output must be greater than a value defined as the sum of the setup and hold time of the D-flip-flops 58 and 60. This will limit the metastable behavior on both D-flip-flops for each sampling point. If one of the delayed signals to the data inputs of D-flip-flops 58 and 60 arrives in the metastable period of one D-flip-flop, then the other signal cannot be in the metastable period of the second one.

Persons of ordinary skill in the art will appreciate that there is still a probability of one of the D-flip-flops sampling data during a setup or hold period. There is no way to avoid this situation but an improvement exists in the definition of the intrinsic delay value (delay line 62) of phase detector 44.

In its locked state, the phase detector 44 defines a number of basic delay elements needed to delay the system clock by half the system clock period. A main objective of the present invention is to get ¼ of the DQS period or ¼ of the DDR-SDRAM device clock period. Therefore a conversion must be performed and applied to programmable delay line connected to DQS control input signals.

Figure 6:
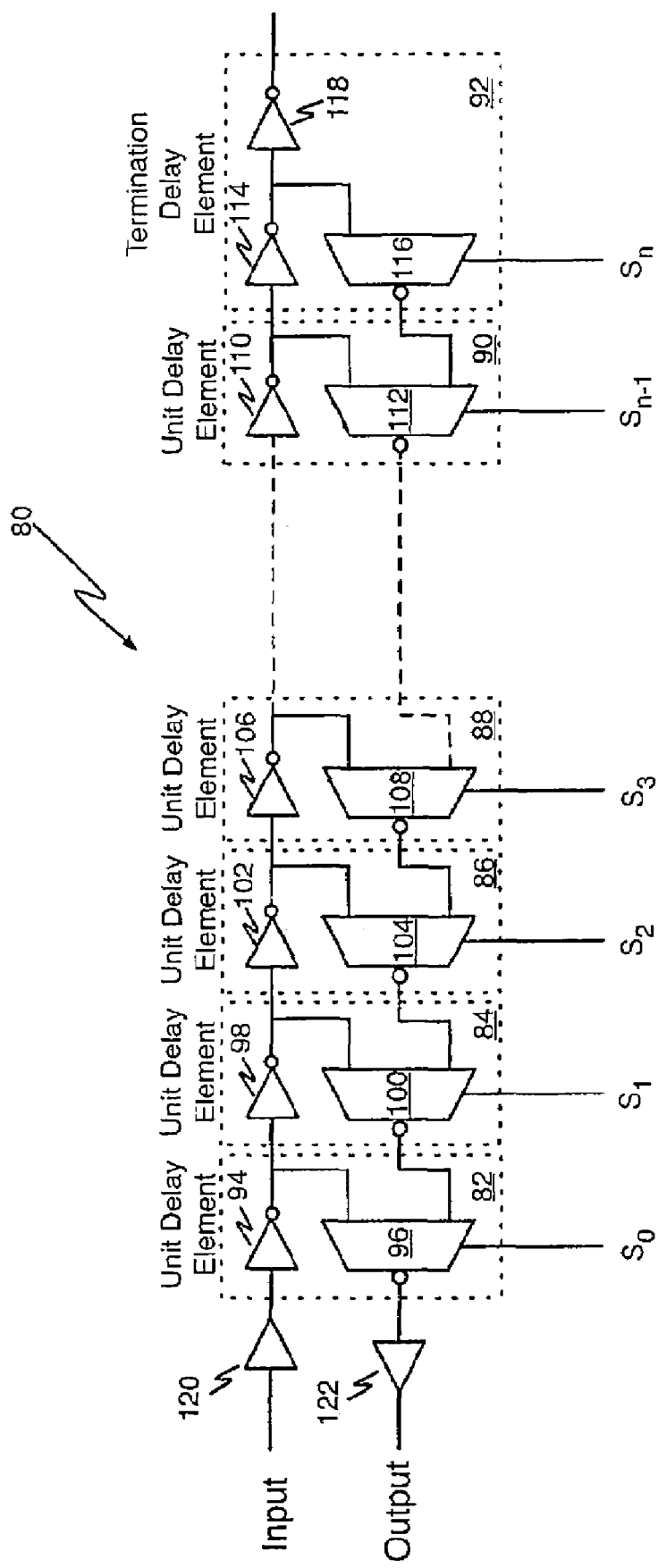
FIG. 6 is a diagram illustrating a typical programmable delay line that is suitable for use in the present invention

Referring now to FIG. 6, an illustrative programmable delay line circuit 80 to use as a programmable delay line such as master programmable delay line 56 in FIG. 5 is shown. The illustrative programmable delay line circuit 80 in FIG. 6 is shown having a plurality of cascaded unit delay elements 82, 84, 86, 88, 90, and 92. Each unit delay element includes an inverter and a multiplexer. The inverter of each unit delay element being cascaded with the inverter of the next unit delay element and the multiplexer of each unit delay element has one input cascaded with the inverter of the previous unit delay element. Thus unit delay element 82 includes inverter 94 and multiplexer 96; unit delay element 84 includes inverter 98 and multiplexer 100; unit delay element 86 includes inverter 102 and multiplexer 104; unit delay element 88 includes inverter 106 and multiplexer 108; unit delay element 90 includes inverter 110 and multiplexer 112; unit delay element 92 includes inverter 114 and multiplexer 116. The purpose of inverter 118 is to balance the capacitive load for each stage of the programmable delay line and therefore it balances the propagation delay of each stage. An input buffer 120 and an output buffer 122 are provided.

Multiplexers 96, 100, 104, 108, 112, and 116 are controlled by switching inputs $S_0$, $S_1$, $S_2$, $S_3$, ... $S_{(n-1)}$ and $S_{(n)}$, respectively. If the select of a unit delay element is set to logic zero, its multiplexer selects the inverted output of the multiplexer in the next unit delay element. If the select of a unit delay element is set to logic one, its multiplexer selects the output of its own inverter. Thus, only one select input in the programmable delay line circuit 80 need be set to logic one, in which unit delay element the signal is turned around and is directed back down through the chain of multiplexers and ultimately to the output buffer 122. Any select input further downstream in the chain that is set to logic one does not affect the operation of the programmable delay line circuit 80.

As an example, if the select inputs $S_0S_1$ are set to logic zero and the select input $S_2$ is set to logic one, the signal will pass through the input buffer 120, inverters 94, 98 and 102, multiplexers 104, 100 and 96, and through output buffer 122. The states of select inputs $S_3$, ... $S_{(n-1)}$ and $S_{(n)}$ will not affect the operation of the circuit.

Referring again to FIG. 5, block 46 functions to convert the data from the output of up/down counter 70 to a value that may be used by the slave programmable delay line circuits 130 and 132 in block 48 of the circuit of FIG. 5. Slave programmable delay line circuits 130 and 132 may also be configured as shown in FIG. 6. Module 46 in the circuit of FIG. 5 performs a converter function and allows to modification of the slave programmable delay line circuits 130 and 132. The Delay Locked Loop comprising phase detector 44 is locked on half the clock period (i.e. the programmable delay line 56 delays the input clock signal on line 54 by half the clock period). Thus, using an identical slave programmable delay line to delay the DQS input control signal by ¼ of the clock period provided to the DDR-SDRAM device, the number of basic delay elements to select is ¼ of the value reported by up/down Counter 70 because the lock is performed on half period of a clock which is divided by 2 versus the clock provided to the DDR memory.

Block 46 includes a fractional coefficient multiplier 134, whose input may be updated as necessary by the output of up/down counter 70. Its output is presented to D-flip-flop 136 via multiplexer 138. The data latched in D-flip-flop 136 is used to drive slave programmable delay lines 130 and 132 of block 48. The select input of multiplexer 138 is driven by the update delay line signal at line 140. As long as the update signal is not asserted, the output of D-flip-flop 136 is fed back to its data input through multiplexer 138. When the update signal 140 is asserted, the input of D-flip-flop 136 is driven by the output of up/down counter 70.

Due to the structure of the programmable delay line 56 as has been shown and described with reference to FIG. 6, the input value to supply to the switching inputs of the multiplexers in the delay line to select the delay amount is not a decimal coded value but rather a one-hot value. Therefore to divide the input value by 4, fractional coefficient multiplier 134 may be configured as a look-up table. The functionality of fractional coefficient multiplier 134 can be seen as a fractional coefficient multiplier on a non-decimal base. Table 1 shows an example of look-up table embedded in fractional coefficient multiplier 134.

TABLE 1

| Input Value | Number of selected basic elements in Master Delay Line | Output Value | Number of selected basic elements in Slave Delay Line |
|---|---|---|---|
| 1000000000000000 | 1 | 1000000000000000 | 1 |
| 0100000000000000 | 2 | 1000000000000000 | 1 |
| 0010000000000000 | 3 | 1000000000000000 | 1 |
| 0001000000000000 | 4 | 1000000000000000 | 1 |
| 0000100000000000 | 5 | 1000000000000000 | 1 |
| 0000010000000000 | 6 | 0100000000000000 | 2 |
| 0000001000000000 | 7 | 0100000000000000 | 2 |
| 0000000100000000 | 8 | 0100000000000000 | 2 |
| 0000000000000001 | 16 | 0001000000000000 | 4 |

Care must be taken when changing the delay value. The value returned by fractional coefficient multiplier 134 cannot be applied to the slave programmable delay line at any time. It is preferable to apply a new value when there is no access being made to data from the DDR-SDRAM device. If this value is altered when the memory device is being accessed, the value must be held to avoid modifying the DQS delay when the DQS signal is in use to avoid the risk of a parasitic pulse when switching from one delay to another one in the programmable delay line. At any rate, if accesses are performed without interruption, there is a need to update the delay to take into account the possible derating factor variations. The DDR-SDRAM devices need to periodically interrupt the accesses to be able to refresh their contents. The times of these refresh cycles are known by the memory controller. This information can be used to safely enable the update of the slave delay line during refresh operations when the DQS signals are not used by the DDR-SDRAM memory controller and glitches on that line will not matter.

If such a scheme is used, when the memory controller (not shown) instructs the DDR-SDRAM device to perform refresh, it asserts a signal on line 140, thereby refreshing the contents of D-flip-flop 136. As soon as refresh period is finished, the line 140 is de-asserted and the multiplexer 138 re-circulates data to D-flip-flop 136.

Figure 7:
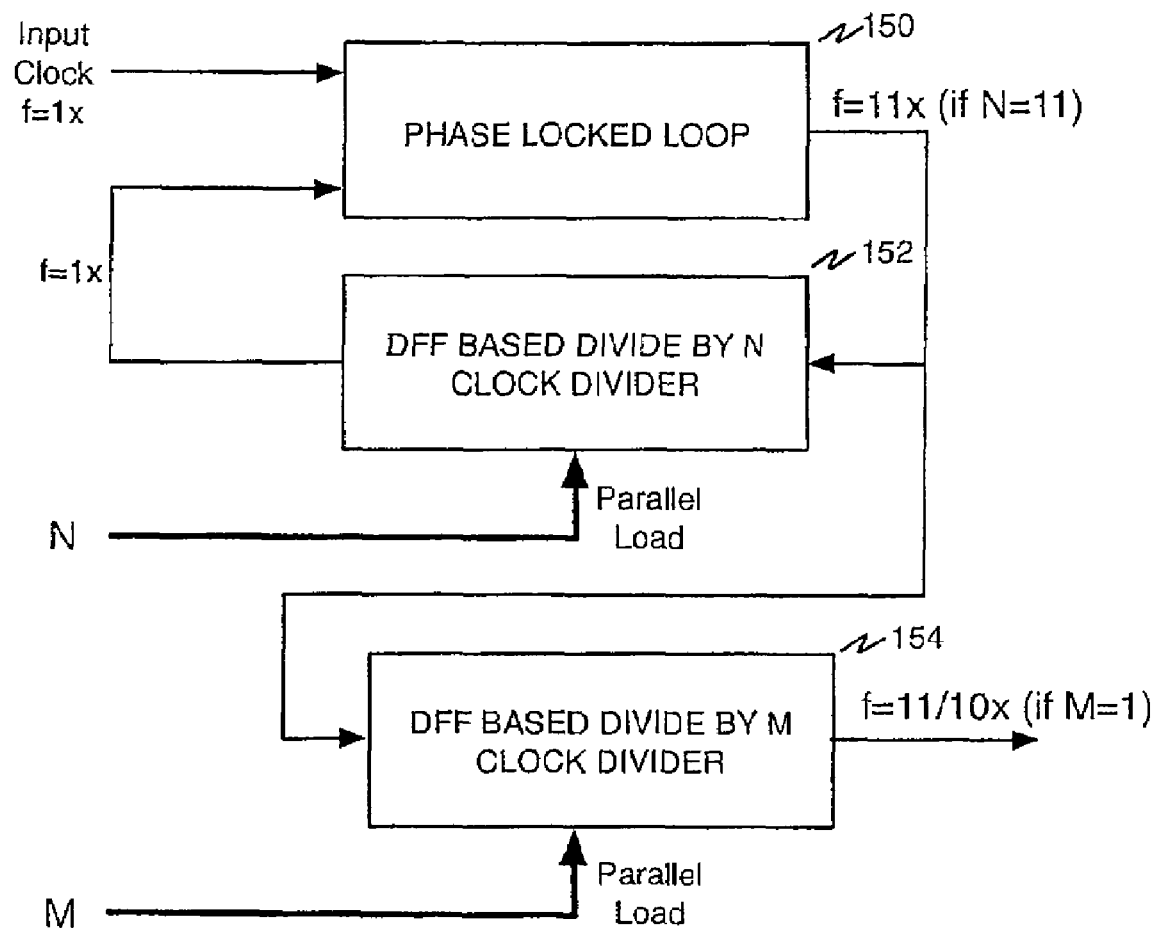
FIG. 7 is a diagram illustrating a N/M multiplier circuit suitable for use in the present invention.

Referring now to FIG. 7, an illustrative circuit for multiplier 52 of FIG. 5 is shown. A N/M multiplier may be formed from a PLL 150 and two clock dividers 152 and 154. As an example, the PLL 150 can multiply the input signal by 8, 9, 10, 11, or 12 and the divide the resulting frequency by 10. The range of frequency on clock line 54 will be within +/−20% of the initial frequency. As a consequence, the delay locked loop module 42 will lock on a different reference delay and the user will have the ability to modify the delay of the DQS signal. The fractional coefficient multiplier can be a single value and, in such a case, the design is simpler than a PLL. It can be a simple divider by two (DFF with negated output connected on its data input).

Figure 9:
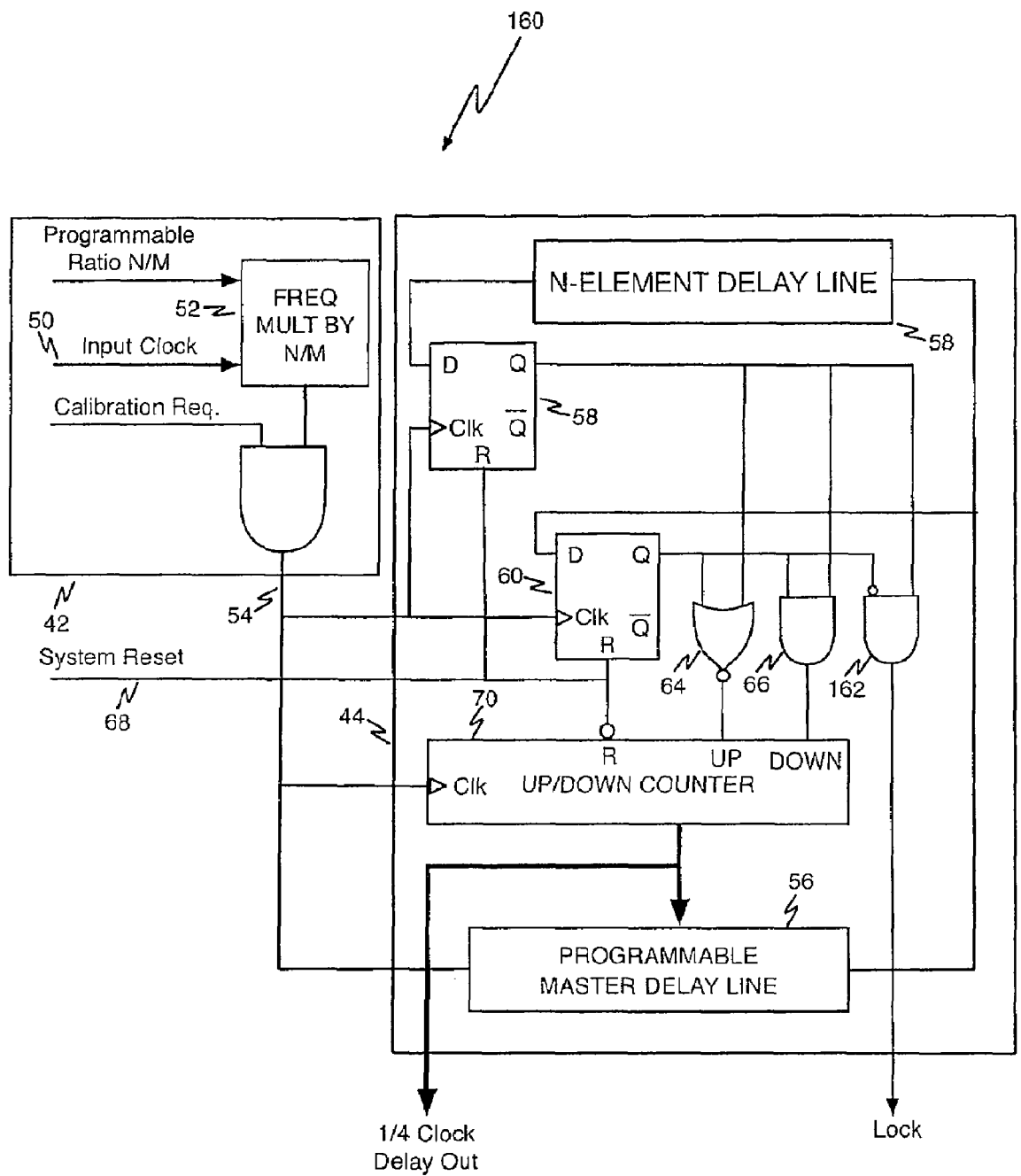
FIG. 9 is a diagram showing another phase detector circuit like that of FIG. 5 and further including an output signal indicating a locked condition.

Referring now to FIG. 9, a diagram shows another phase detector circuit 160 like that of FIG. 5 but further including an output signal indicating a locked condition of the detector. The elements of the phase detector circuit 160 of FIG. 9 that correspond to elements of FIG. 5 are identified by the same reference numerals that are used in the circuit of FIG. 5.

As in the example shown in FIG. 5, the phase detector circuit 44 includes D-flip-flops 58 and 60, delay line elements 58 including a limited number of basic delay elements, a NOR gate 64 and an AND gate 66. The circuit is driven by clock input 54, and uses the output of delay line 62 and the output of the programmable delay line 56 as a feedback clock. In addition to these elements that are shown also in FIG. 5, the phase detector circuit of FIG. 9 includes AND gate 162 having the one of its inputs that is driven from the output of D-flip-flop 58 inverted. The other input driven from the output of D-flip-flop 60 is not inverted. The output of 162 will be used to instruct the fine delay tuning that the master circuitry is locked.

When system reset is asserted on line 68, the D-flip-flops 58 and 60 are cleared, the programmable master delay line provides a feedback clock at the output of master programmable delay line 56 delayed by a single basic delay element because the up/down counter 70 is set accordingly from the outputs of NOR gate 64 and an AND gate 66.

After de-assertion of system reset on line 68, the D-flip-flops 58 and 60 start sampling logical "0" (the low portion of the waveform at the output of master programmable delay line 56). When the outputs of both D-flip-flops are cleared, the 2-input NOR gate 64 provides a logical 1 at the "UP" input of up/down counter 70 to indicate that the phase detector 160 is unlocked and requires more basic delay elements to be included in the master programmable delay line to reach the lock state. The 2-input AND gate 66 drives the "DOWN" input of the up/down counter 70 with a logical "0" to indicate that there is no need to remove delay elements in the programmable delay line 56. The output of AND gate 162 provides a logical "0" to indicate that the phase detector 160 is unlocked.

If the delay becomes greater than the reference delay provided by the clock period of the system clock, both D-flip-flops 58 and 60 sample a logical "1." The 2-inputs NOR gate 64 returns logical "0" to the "UP" input of up/down counter 70 and the 2-input AND gate 66 provides a logical "1" to the "DOWN" input of up/down counter 70. Under these conditions, up/down counter 70 modifies the value provided on its output to instruct the master programmable delay line 56 to remove one basic delay element. The master programmable delay line decreases its internal delay accordingly. The phase detector 160 is still in its unlocked phase.

When the programmable delay line 56 delays the system clock on signal line 54 by half the system clock period (locked state), D-flip-flop 58 samples a logical "1" whereas D-flip-flop 60 samples a logical "0" because of the presence of delay line 62 in the path of the data input of D-flip-flop 58.

Delay line 62 allows locating the falling edge of the delayed feedback clock at the output of delay line 62 to a time after the rising edge of system clock on line 54 and locating the falling edge of the feedback clock prior to the rising edge of the system clock on line 54. In this case both NOR gate 64 and AND gate 66 provide logical "0" to the "UP" and "DOWN" inputs of up/down counter 70. The output of up/down counter 70 does not change, and the output of AND gate 162 presents a logical "1" to indicate that the phase error provided by the phase detector 160 is zero and the phase detector 160 is thus locked.

Figure 10:
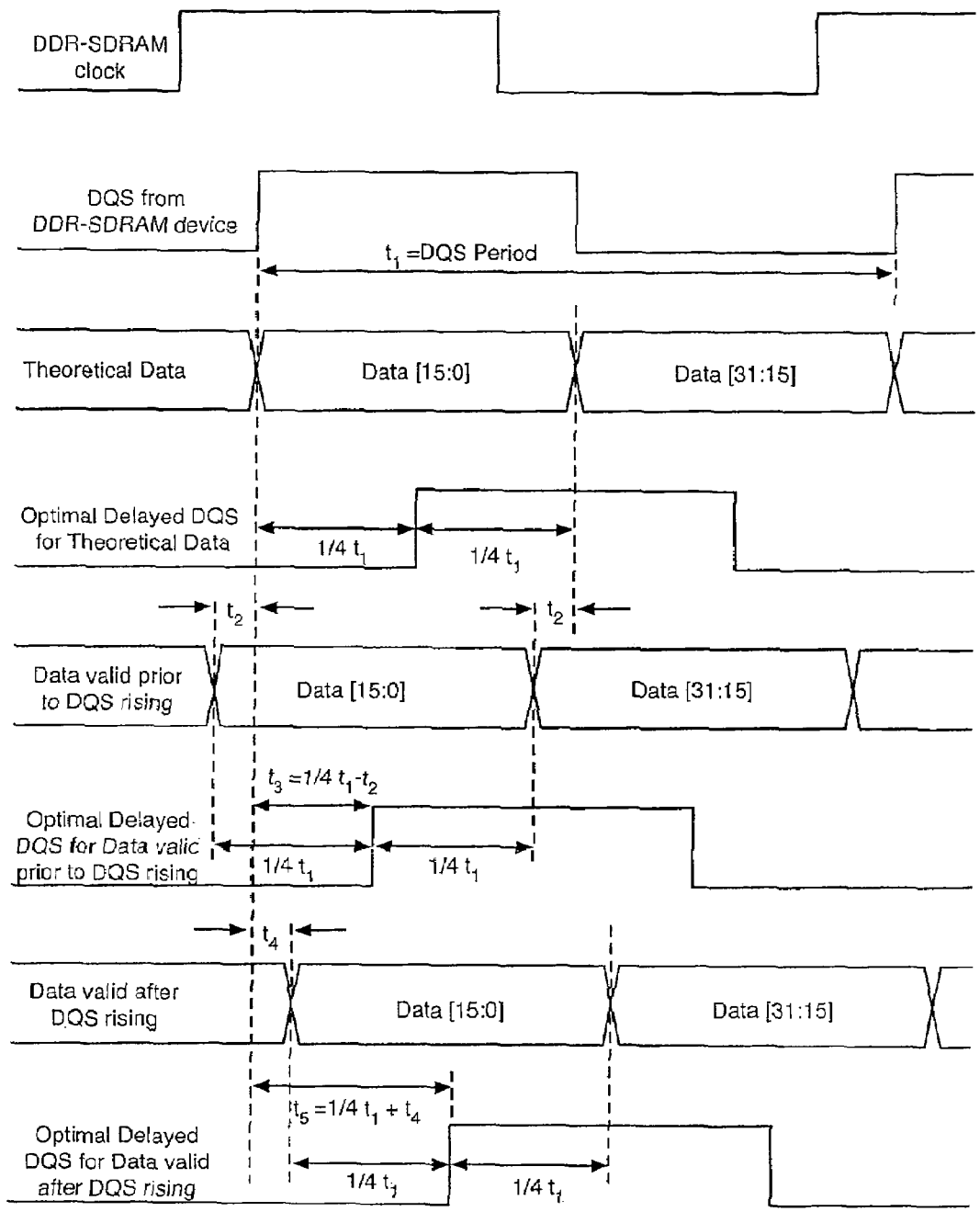
FIG. 10 is a series of timing diagrams illustrating the several relative timings between valid data and a DQS signal.

Referring now to FIG. 10, a series of timing diagrams illustrates the several relative timings between valid data and a DQS signal. The first three traces of FIG. 10 show, respectively, the DDR-SRAM clock, the DQS signal from the DDR-SRAM device during a read operation, and the ideal positioning of valid data from the read operation as being edge aligned with the DQS signal. The period of the DQS signal is indicated as time $t_1$. The fourth trace of FIG. 10 shows the DQS signal optimally delayed by a time $\frac{1}{4}t_1$.

The fifth trace of FIG. 10 shows a condition where read data is valid at a time interval $t_2$ prior to the rising edge of the DQS signal. Under this condition, the DQS signal should optimally delayed by a time $t_3=\frac{1}{4}t_1-t_2$ as shown in the sixth trace, so that the edge of the DQS signal follows the edge of the valid data by a time equal to $\frac{1}{4}t_1$.

The seventh trace of FIG. 10 shows a condition where read data is valid after a time interval $t_4$ following the rising edge of the DQS signal. Under this condition, the DQS signal should optimally delayed by a time $t_5=\frac{1}{4}t_1+t_4$ as shown in the eighth trace, so that the edge of the DQS signal follows the edge of the valid data by a time equal to $\frac{1}{4}t_1$.

Figure 1A:
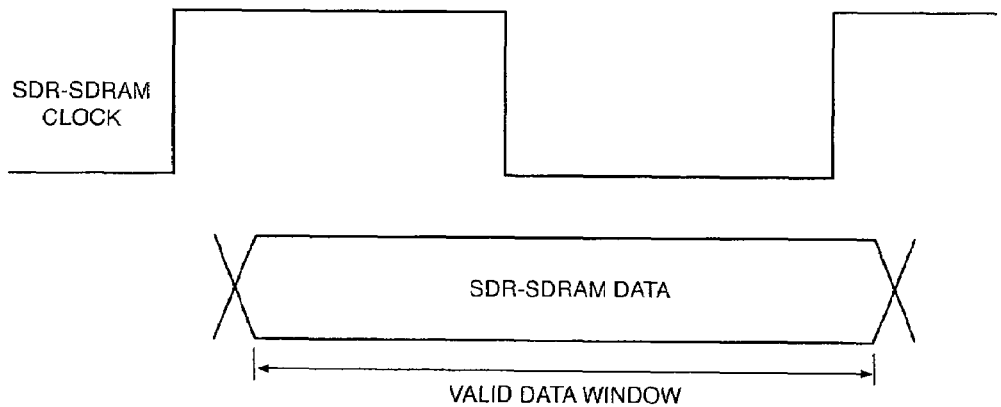
FIG. 1 is a timing diagram illustrating the valid data window of SDR-DRAM and DDR-DRAM devices.
Figure 1B:
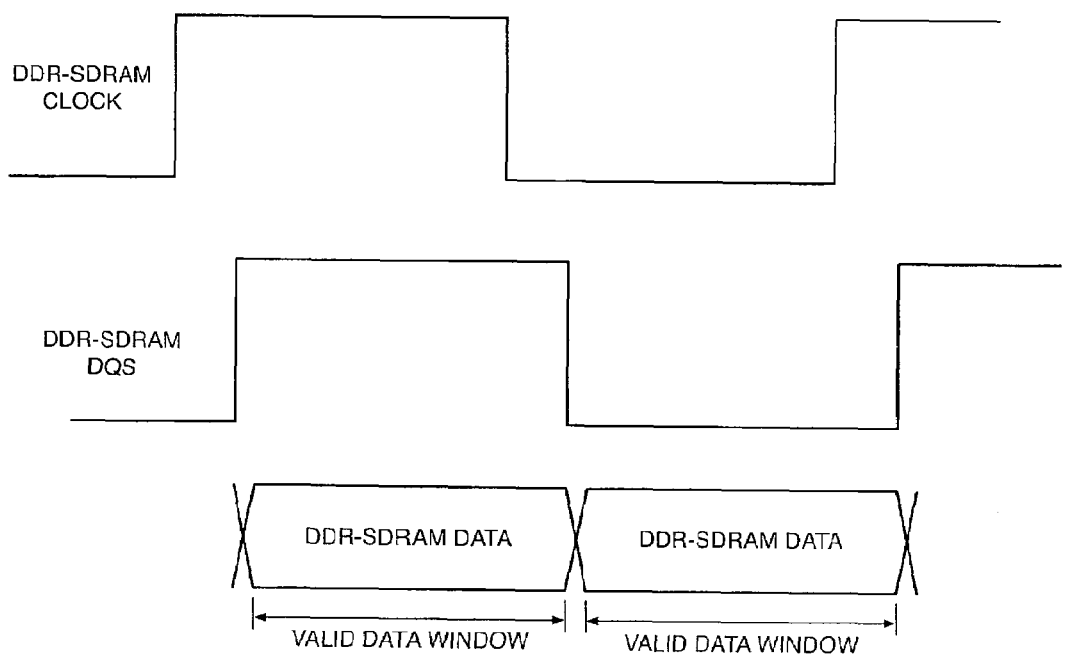
Figure 2:
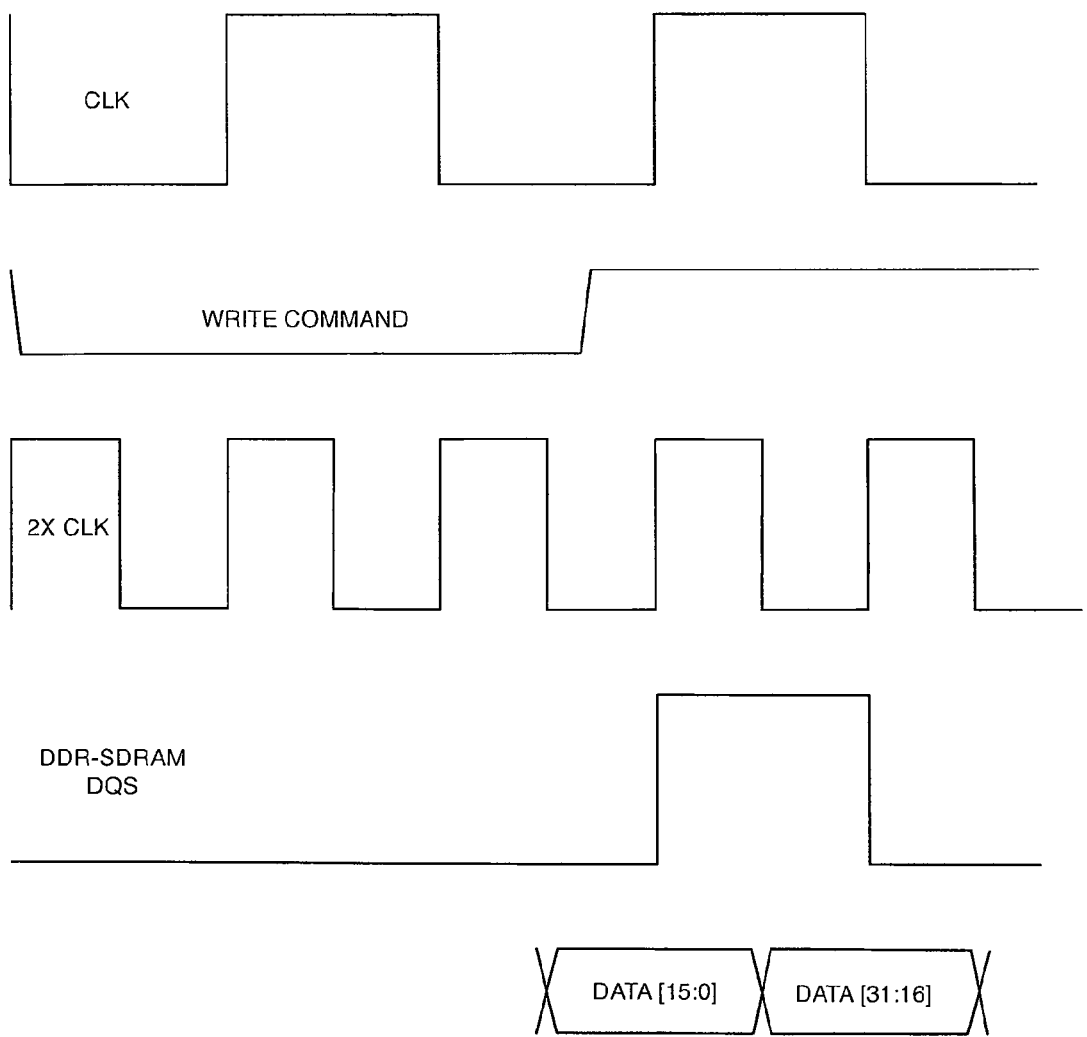
FIG. 2 is a timing diagram illustrating a typical DDR-SDRAM write access.
Figure 3:
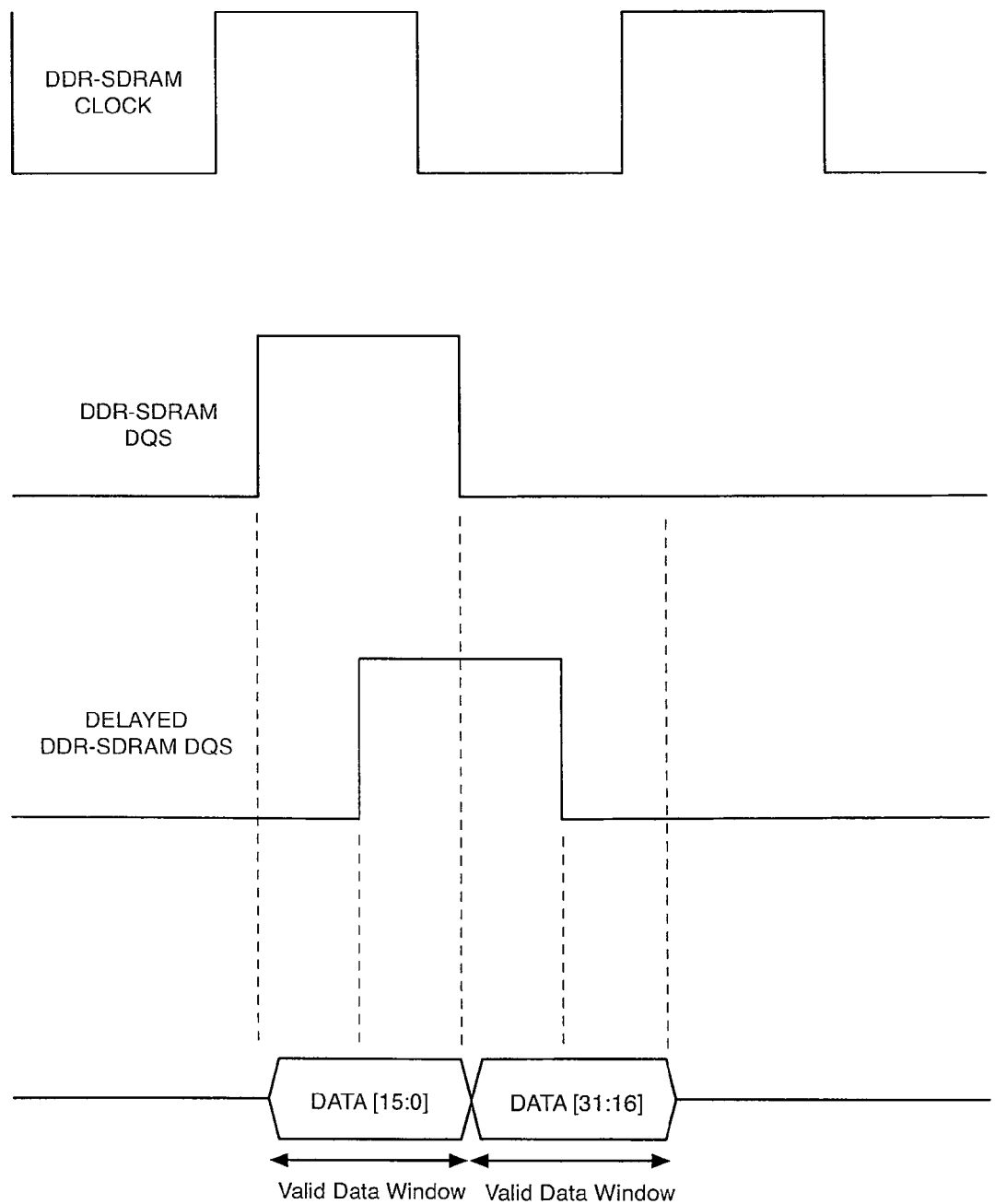
FIG. 3 is a timing diagram illustrating a typical DDR-SDRAM read access.

Referring now to FIG. 1, a diagram illustrates a DQS delay circuit 170 according to the principles of the present invention. Like the circuit of FIG. 5, the DQS delay circuit 170 of FIG. 11 uses the system clock on signal line 172 and a calibration request signal on line 174 to drive a calibration request input in delay-locked loop and sample/hold circuit 176 through OR gate 178. The other input of OR gate 178 is driven by an enable-measure signal asserted on enable-measure signal line 180. The delay-locked loop and sample/hold circuit 176 outputs a lock signal and a multi-bit ¼ clock delay signal used to drive the slave delay units as disclosed with reference to FIG. 5.

The enable-measure signal on signal line 180 also drives enable circuitry 182. When enabled by asserting the enable-measure signal on signal line 180, enable circuitry 182 examines the state of the lock signal output of delay-locked loop and sample/hold circuit 176 on line 184, and the output of D-flip-flop 186 which functions as a phase detector to detect any delay between the DQS signal and the data from the DDR-SDRAM. The measurement of any DQS/data delay difference will only be performed when the master delay locked loop circuit is in its locked state.

The clock input of D-flip-flop 186 is driven from the output of programmable slave delay line (0) 188 and the data input of D-flip-flop 186 is driven from the output of programmable slave delay line (1) 190. The inputs to both programmable slave delay line (0) 188 and programmable slave delay line (1) 190 are driven through identical multiplexers 192 and 194. Multiplexer 192 has its select input connected to ground so that it always passes the data from its "0" input to its output. The data presented to its "0" input is the DQS (0) signal from the DDR-SDRAM. Multiplexer 194 has its select input connected to the enable-measure signal line 180, its "0" input to the DQS (1) signal from the DDR-SDRAM, and its "1" input to a data bit output (such as the data[0] bit) from the DDR-SDRAM.

During the measurement process, two memory addresses in the DDR-SDRAM are loaded with a "0" and a "1" respectively and the address bus of the DDR-SDRAM is toggled between those two memory addresses so that the output data from the DDR-SDRAM appearing at the "1" input to multiplexer 194 is a square wave having the same frequency as the DQS signal. During normal operation of the circuit, multiplexer 194 passes the DQS(1) signal to the input of programmable slave delay line (1) 190. The enable-measure signal selects the data from the DDR-SDRAM to appear at the output of multiplexer 194 during the measurement process. Multiplexer 192 is placed in the DQS signal data path simply to prevent phase error from being introduced by multiplexer 194 in the data path. Persons of ordinary skill in the art will observe that the multiplexers are not needed in systems that have a single DQS signal.

Programmable slave delay line (1) 190 delays the toggled square-wave data output signal from the DDR-SDRAM at the output of multiplexer 194, providing a delayed signal at output on line 196 of programmable slave delay line (1) 190. At the beginning of the measurement process, the selected delay is close to zero, and thus the rising edge of the signal on line 196 coupled to the data input of D-flip-flop 186 occurs prior to the delayed DQS signal on line 198 at the output of programmable slave delay line (1) 190 coupled to the clock input of D-flip-flop 186. The output of D-flip-flop 186 will latch a logical "1" and present a clock pulse to increment the counter 200 so long as the state of the lock signal output of delay-locked loop and sample/hold circuit 176 on line 184 is locked, the enable measure signal on line 180 is asserted and the end measurement signal at line 202 is unasserted, AND gate 206 drives a logical "1" to the select input of multiplexer 208, which passes the counter output to programmable slave delay line (1) 190. The output of AND gate 206 also drives a logical "1t" to the select input of multiplexer 210, thus passing the ¼ clock delay output of master delay locked loop circuit 176 through multiplexer 210 to control the delay in programmable slave delay line (0) 188.

Thereafter, the circuitry will start the measuring process by incrementally delaying the data signal on line 196 with respect to the delayed DQS signal that is used to clock D-flip-flop 186. Once the count has incremented to a value that causes a delay in programmable slave delay line (1) 190 sufficient to cause the delayed DQS signal driving the clock of D-flip-flop 186 to latch a logical "0" at the output of D-flip-flop 186 and present it to enable circuitry 182 on low_delay signal line 212, counter 200 stops incrementing. At this point, the ratio-calculating and FSM circuit 214 starts performing its calculation.

Figure 11:
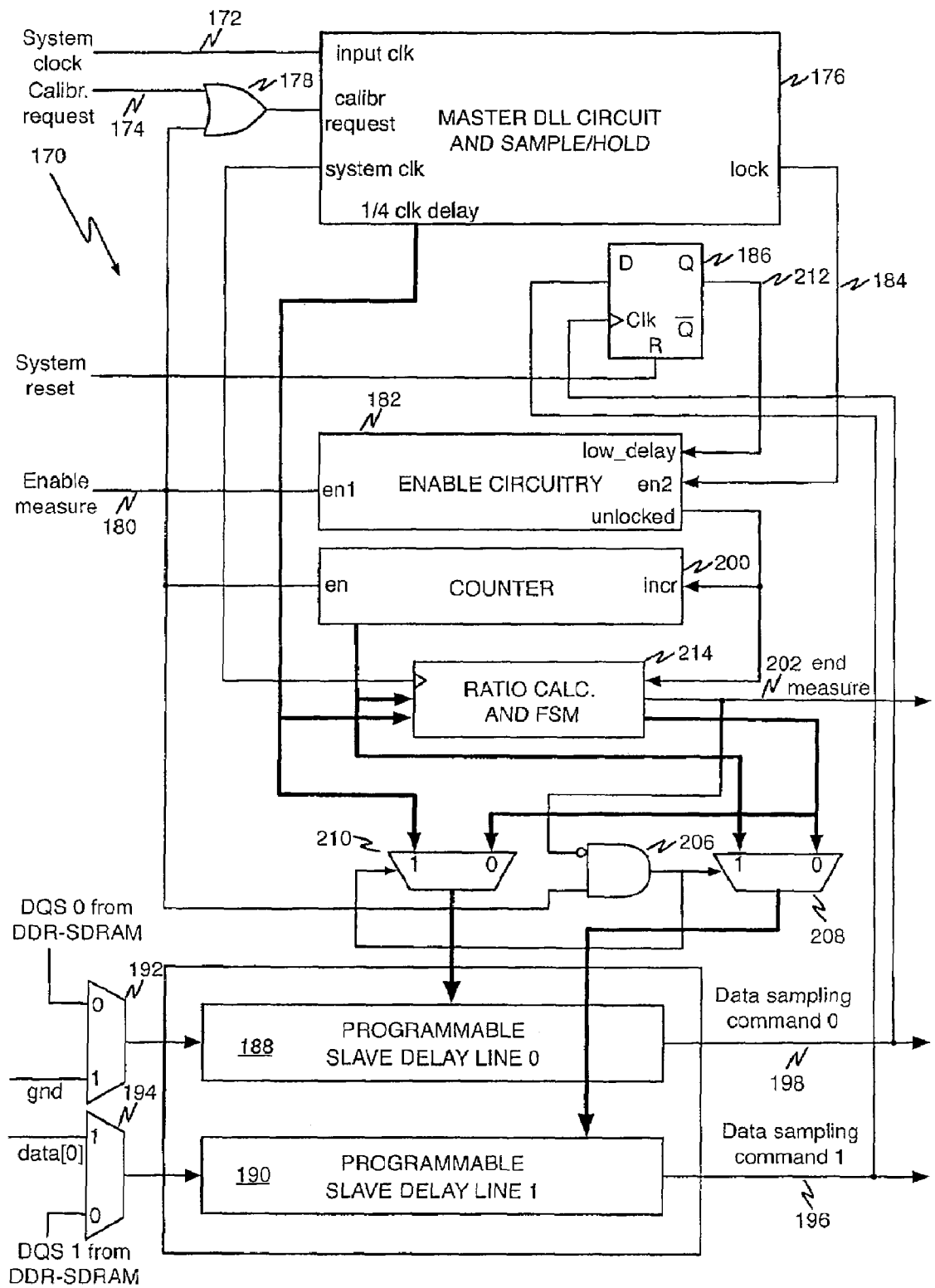
FIG. 11 is a diagram illustrating a DQS-delay circuit according to the present invention.
Figure 12:
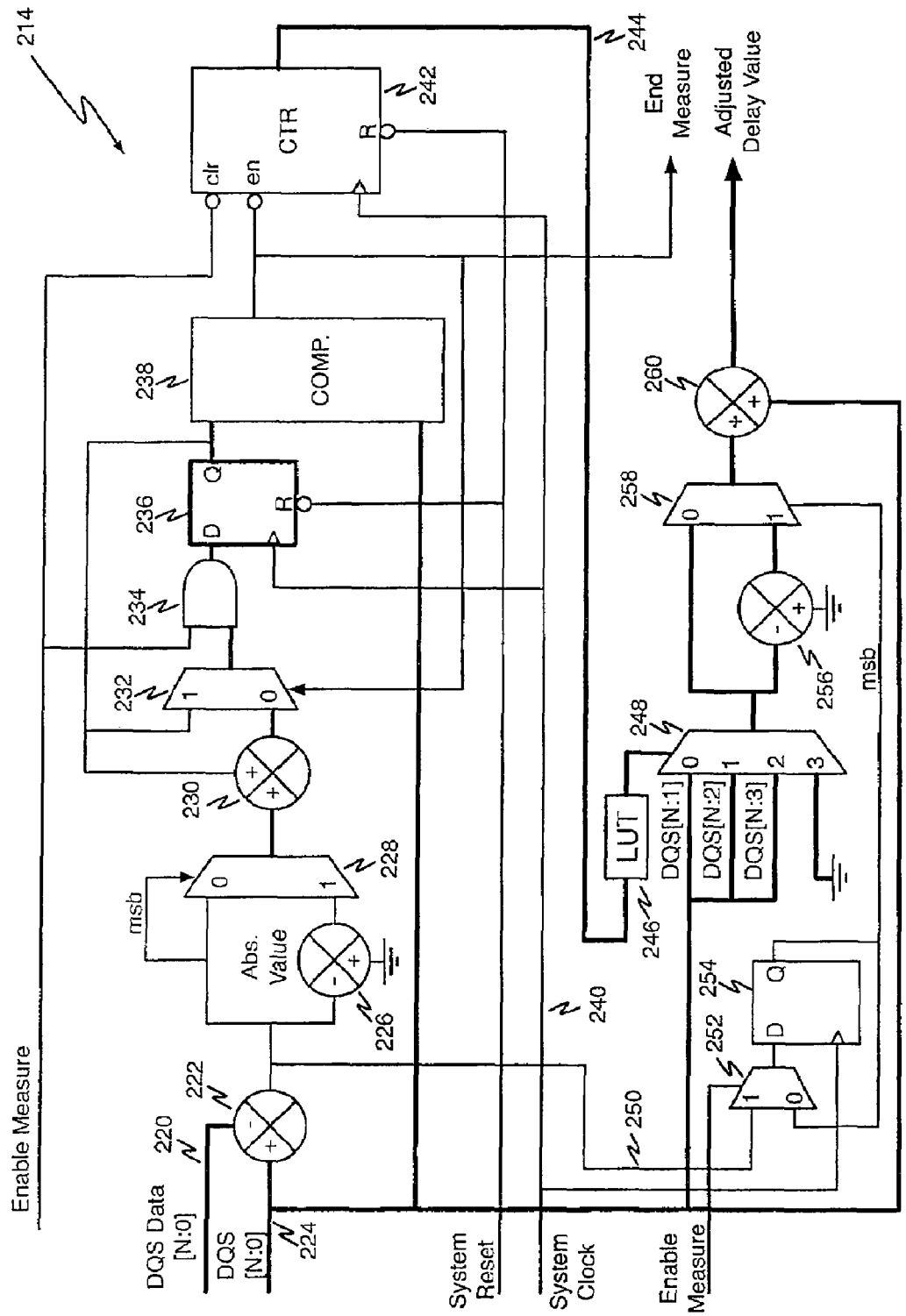
FIG. 12 is a diagram illustrating an example of a ratio calculating and FSM circuit suitable for use in the circuit of FIG. 11.

Referring now to FIG. 12, a diagram illustrates an example of a ratio-calculating and FSM circuit 214 suitable for use in the circuit of FIG. 11 according to the principles of the present invention. According to the present invention, to be able to adjust the theoretical ¼ clock delay provided by master delay locked loop circuit 176 of FIG. 11 when the memory device is powered, the ratio between both delays is calculated. First, the count representing the amount of delay required to align the delayed data on line 196 of FIG. 11 with the delayed DQS signal on line 198 of FIG. 11 is presented to the subtrahend input 220 of subtractor circuit 222 and the count representing the delayed DQS signal is presented to the minuend input 224 of subtractor circuit 222. The output of subtractor circuit 222 is the difference in delay between the rising edge of the DQS signal and the edge of the data signal. The output of subtractor circuit 222 is a signed value because the rising edge of the DQS signal may be located either before or after the edge of the data signal. According to the sign of the difference, carried by the MSB of the output of subtractor circuit 222, the operating adjustment will be positive or negative.

The difference between the two delays is compared to the DQS delay on signal line 224, but first the absolute value is calculated to further obtain a ratio. Subtractor circuit 226 and multiplexer 228 together function as an absolute value circuit in which the difference between the two delays is presented to the subtrahend input of subtractor circuit 226 and to the "0" input of multiplexer 228, a value of "0" (shown symbolically as ground) is presented to the minuend input of subtractor circuit 226, the output of subtractor circuit 226 is presented to the "1" input of multiplexer 228, and the MSB (sign) bit of the difference value is presented to the select input of multiplexer 228.

Adders 230, multiplexers 232, AND gates 234, and D-flip-flops 236 together function as a multi-bit accumulator, the output of which is compared in comparator 238 to the count representing the delayed DQS signal on line 224. When the enable measure signal on line 240 is not asserted, AND gates 234 maintain the accumulator in a "cleared" state. When the enable measure signal on line 240 is asserted, and the end measure signal is cleared, the multiplexer 232 selects the output of the adder 230. The set of AND gates 234 is transparent because the enable measure signal on line 240 is asserted. Together with comparator 238 and counter 242, they provide at the output of counter 242 an image of the ratio between number of cascaded basic elements to produce the clock period and the number of cascaded basic elements to produce a delay equivalent to the delay difference between DQS and a bit of DATA.

On the first rising edge of the system clock on line 240, the set of D-flip-flops 236 latch the phase difference present at the output of the absolute value circuit because the reset value of the D-flip-flops is a logical "0." This first value is compared in comparator 238 with the delayed DQS signal on line 224 and is, of course, lower in value, leaving the output of comparator 238 at a logical "0" state. Multiplexer 232 thus still selects the output of adders 230 as its input. The output of the D-flip-flops 236 (the phase difference) accumulates at the output of the D-flip-flops 236 at each rising edge of the system clock. The counter 242 increments since its enable input (the output of comparator 238) is still at a logical "0."

When the value at the outputs of the D-flip-flops 236 becomes higher than (or equal to) the value of the delayed DQS signal on signal line 224, the counter is no longer enabled and the accumulator stops because the select input of multiplexer 232 now selects the recirculated value out of the D-flip-flops. The ratio between the values on signal lines 220 and 224 is now present at the output of counter on signal lines 244.

As an example of the operation of the circuit of FIG. 12, if the ¼ DQS period requires 36 basic delay elements in the programmable delay line and the delay between the rising edge of the data[0] to the rising edge of the DQS signal requires 9 basic delay elements, the ratio is 1:4. The accumulator starts at zero through 9, 18, 27, and 36, and the respective values of the signal at the output of the comparator 238 are 0, 0, 0, and 1. Counter 242 will count up to four. In operation of the present invention, values may range between about 8 and 2. Lower values may indicate that the difference in delay between the rising edges of the data and the DQS signal are critical and may be unacceptable for correct operation of the DDR-SDRAM memory device. Higher values may indicate there is nothing significant to adjust.

To make the adjustment according to the formula:

$$ADJdelay = TheoreticalDelay +/- (ratio \times theoretical\ delay),$$

the ratio is 1/N where N is the value in the counter at the end of the measurement, it is required that N be an integer. To simplify the delay correction circuitry of the present invention, the counter value on signal lines 244 is reduced to a power of 2 to enable the use of simple circuitry for performing the division. This reduction is performed by LUT 246, which simply converts the counter output to static decimal values 2, 4, and 8. Table 2 shows an exemplary truth table for LUT 246.

TABLE 2

| Decimal Input | Decimal Output | Ratio |
|---|---|---|
| 2 | 0 | ½ |
| 3 | 0 | ½ |
| 4 | 1 | ¼ |
| 5 | 1 | ¼ |
| 6 | 1 | ¼ |
| 7 | 2 | ⅛ |
| 8 | 2 | ⅛ |
| 9, 10, . . . | 3 | No Adjustment |

Dividing by powers of 2 employs simple circuitry to right-shift the data. The output of LUT 246 drives the select input of multiplexer 248 to select the appropriate bits of the data from signal line 224 that represent the appropriate bit shifted data which represents ½, ¼, ⅛ of the value carried on signal 224. The value is still positive, but may be added or removed depending on the sign of the phase difference (the MSB) carried on signal line 250. The MSB signal on line 250 is latched by multiplexer 252 and a DFF 254. This is mandatory because when the system is not in the measure mode, the MSB of subtractor circuit 222 does not have the same meaning and that value must be available at the end of measure period. The output of DFF 254 holds this value when the system is not in the measure mode.

If there is a need to remove delay from the theoretical optimal delay in cases where the rising edge of the data occurs prior to the rising edge of the DQS signal, the value to align the delayed data with the delayed DQS signal requires a delay lower than a ¼ clock delay and the signal is negative (MSB set). The choice of addition or subtraction is accomplished by using subtractor circuit 256 and multiplexer 258. The output of multiplexer 248 is presented to the subtrahend input of subtractor circuit 256 and "0" (shown symbolically as ground) is presented to the minuend input of subtractor circuit 256. The sign bit (MSB value) is used to drive the select input of multiplexer 254. The output of the multiplexer 258 provides either the negative value of the ratio multiplied by the DQS delay when the MSB is set or the positive value when the MSB is not set. Finally, the properly signed ratio multiplied by the DQS delay is added to the ¼ clock period DQS delay in adder 260. During operation, if the number of basic delay elements required to delay the DQS signal by ¼ clock period changes, the number of delay elements needed to adjust the DQS/data difference will automatically be updated without a need to calculate the required number of delay elements.

The adjusted delay will be provided to the slave programmable delay lines 188 and 190 of FIG. 11 through multiplexers 208 and 212 of FIG. 11. When the end of measure signal is asserted, AND gate 206 selects the "0" inputs of multiplexers 208 and 212.

Because it is likely that a delay difference may occur between each individual data bit on the data bus, persons of ordinary skill in the art will realize that the circuits of FIGS. 11 and 12 can separately calculate the delay for each data bit on the bus and calculate an average of the ratios to use to adjust the theoretical optimal delay. Further, the adjustment of DQS(1) signal may be accomplished by selecting among the data read on the DQS(1) half of the DDS-SDRAM read cycle and comparing it with the DQS(1) signal in the same manner as taught herein for the DQS(0 signal.

The accuracy of the fine delay adjustment may be enhanced according to the present invention. In the embodiments shown in FIGS. 11 and 12, the delay ratio between ¼ clock period and the delay between DQS/DATA is first calculated, and then the fine delay tuning is based on this ratio. For example, ¼ clock period requires 100 cascaded basic elements, i.e. @ 100 Mhz: 2.5 ns requires 100 elements, if DQS and DATA have a delay difference of 650 ps, 25 basic elements will be required to correct this difference. In the embodiments disclosed so far herein, if the temperature decreases (and the intrinsic delay of basic element also decreases), the number of elements required to produce a ¼ clock period delay would be, for example, 200 elements and the fine adjustment applied would be 50 basic elements to obtain the same adjustment ratio (100/25=200/50).

Using this scheme, the ¼ clock period remains identical in terms of time (2.5 ns) whereas the DQS/DATA difference has a great probability of being reduced from 650 ps to 325 ps (illustrative values only). Therefore the number of delay elements is 25 rather than 50. To obtain non-linearity in the ratio the circuitry of FIG. 12 may be simplified. Such a simplified scheme is shown in circuit 260 of FIG. 13.

Figure 13:
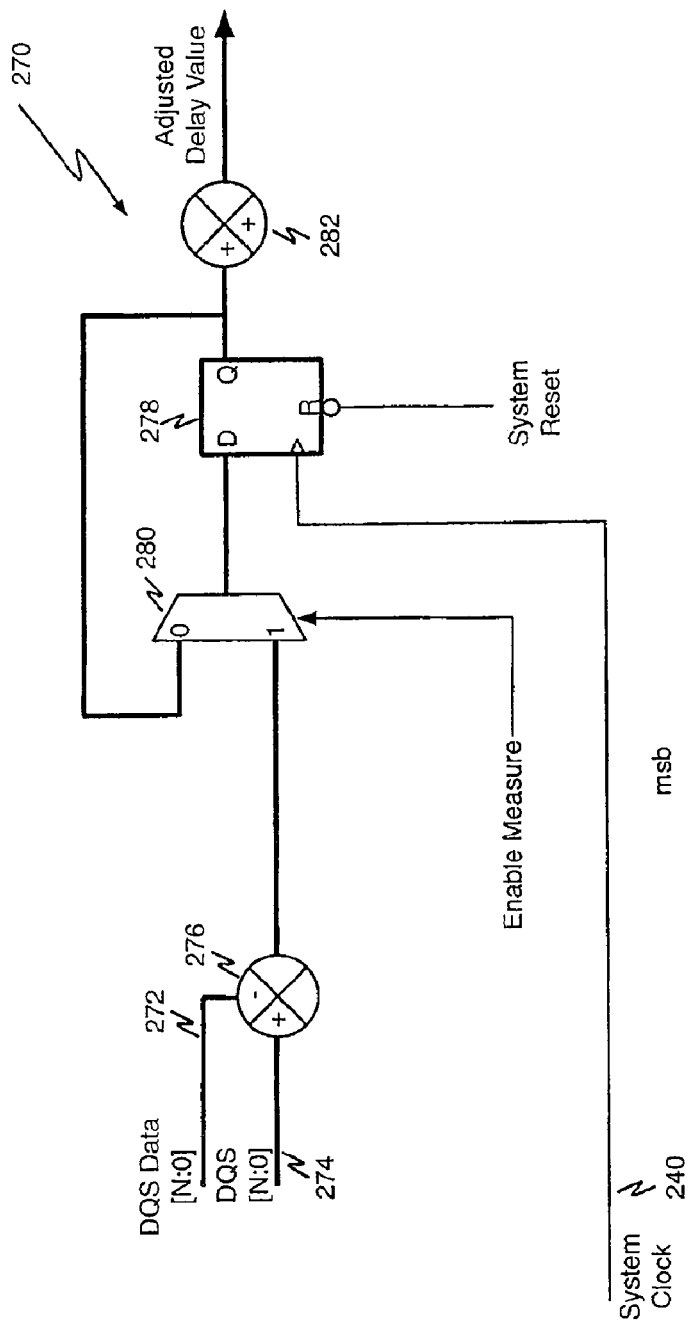
FIG. 13 is a diagram illustrating another example of a ratio calculating and FSM circuit suitable for use in the present invention.

Referring now to FIG. 13, it is seen that, in circuit 270, the difference between number of delay elements carried on lines 272 and 274 is calculated by subtractor 276 and stored into DFF storage element 278 by re-circulating its output by means of set of multiplexers 280 when the enable measure signal is de-asserted at the select input of multiplexers 280. When the enable measure signal is asserted, the DFFs sample the difference. This difference in the number of elements will be added to the value on line 274 in adder 282. The number carried on the output of DFFs 278 is a signed value, therefore a simple adder 282 is used to add or subtract from the value on line 274.

Assuming the same values used in the previous example, if the delay difference decreases from 650 ps to 325 ps, the number of cascaded basic elements involved in the adjustment will not be 50 but 25 because the number of basic elements is involved in the adjustment rather than a constant ratio that increases or decreases the number of elements.

Moreover, for cell place-and-route improvement, the architecture may be further modified by removing the multiplexers 192 and 194 and performing checks on data read from the memory devices as will now be described with referenced to FIG. 14. This architecture provides exactly the same functionality as the architecture embedding multiplexers as was shown in FIG. 11. This modification can employ either a ratio adjustment or the adjustment described with reference to FIG. 13.

Figure 14:
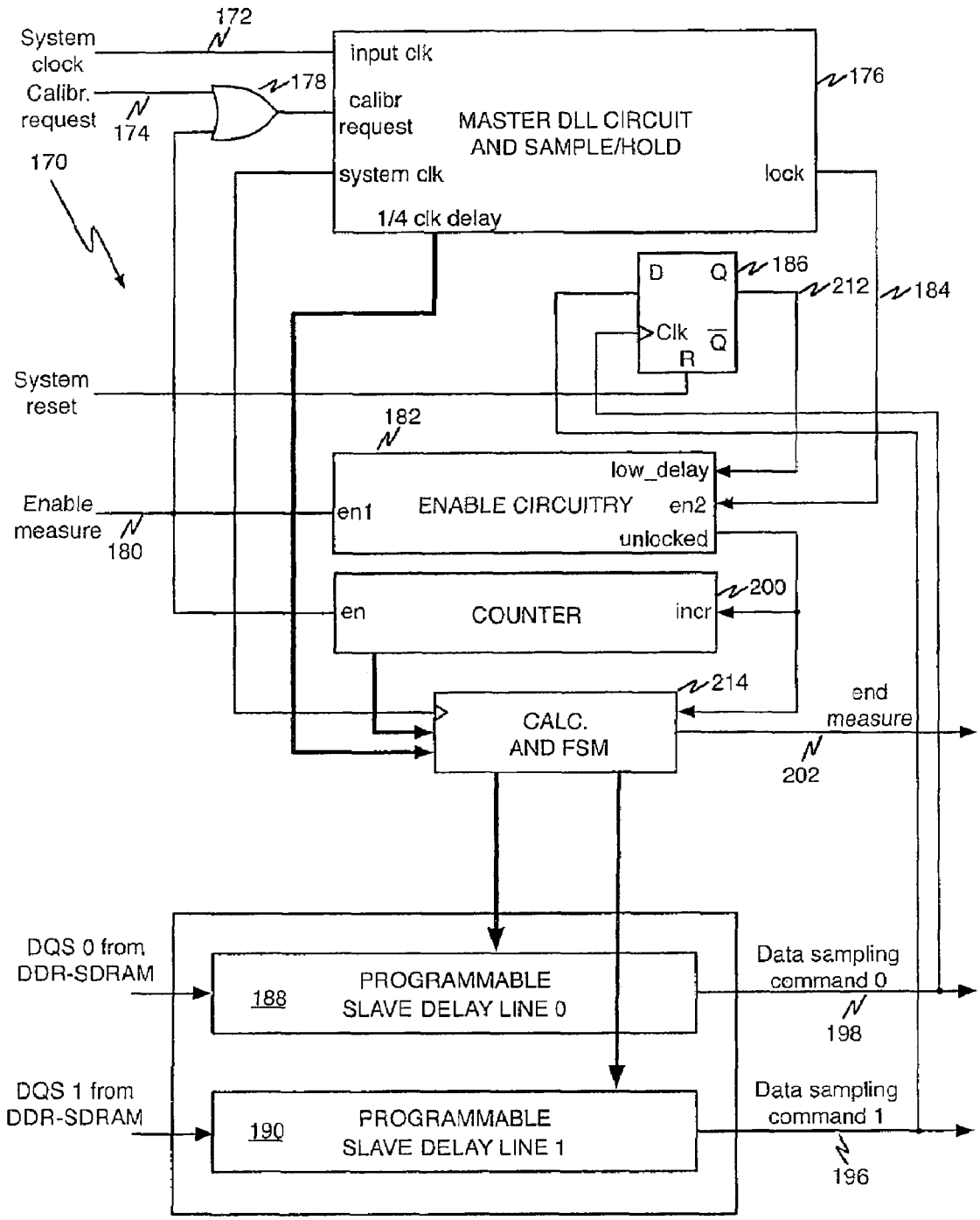
FIG. 14 is a diagram illustrating another DQS-delay circuit according to the present invention.

Referring now to FIG. 14, it may be seen that the circuit is substantially similar to the circuit of FIG. 11. The programmable slave delay lines 188 and 190 receive the DQS 0 and DQS 1 signals. Specific data is written in the memory device as described with referenced to FIG. 11. The DQS signals are delayed with the theoretical ¼ clock period, and the data is sampled and checked. If the data matches the specific expected value, the DQS is delayed by 1 less basic delay element than the theoretical value. The data read from the memory device is checked again, if it matches the specific expected value, the delay is decreased again by one basic element (the module FSM 214 setting the select input of the programmable delay accordingly) and so on.

As soon as the read data does not match the specific data, the module FSM 214 stores this minimum number of delay elements in a first register formed from DFF and multiplexer elements. Then the DQS delay is initialized again with the theoretical value and the process is repeated except that the programmable delay is increased instead of being decreased. As soon as the read data does not match the specific pattern the FSM module 214 stores the second number of basic elements in a second set of registers formed from DFF and multiplexer elements. At this point, the output of both registers are sent to a subtractor, subtracting the value in the first register from the value in the second register. Then a selected of the subtractor output is kept. The LSB is unused to provide a divide by 2. This divide by 2 value corresponds to the number of basic elements to be cascaded in the programmable delay line to get the optimal DQS sampling point due to the DQS/DATA phase difference. To keep track of this DQS/DATA difference further during usage of the DDR controller (i.e. during functional operation of the memory device), the location of the optimal sampling point with the theoretical sampling point carried on output of master DLL output is known. To get the difference, the divided by 2 value and the theoretical ¼ clock period are the inputs of the circuit of FIG. 13 on lines 272 and 274. The delay to adjust (second delay) is automatically calculated from a real DQS/data difference, and there is no need for firmware/software to enter a value in calculation/fsm module 214.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method comprising:
  receiving a control signal and a data signal;
  determining a first number of delay elements to obtain a first time delay corresponding to a targeted portion of a period of a clock signal;
  determining a second number of delay elements to obtain a second time delay corresponding to a timing difference between an edge of the data signal and an edge of the control signal;
  calculating a ratio of the second number of delay elements to the first number of delay elements; and
  applying a third time delay, based at least in part on a value of the ratio, to the control signal to generate a delayed control signal.

2. The method of claim 1, wherein the targeted portion of the period of the clock signal is equal to one-fourth of the period of the clock signal.

3. The method of claim 1, wherein applying the third time delay to the control signal includes using a third number of delay elements to delay the control signal, and wherein the third number of delay elements is equal to the first number of delay elements minus a product of the first number of delay elements and the value of the ratio.

4. The method of claim 3, wherein the edge of the data signal occurs before the edge of the control signal relative to an edge of the clock signal.

5. The method of claim 1, wherein applying the third time delay to the control signal includes using a third number of delay elements to delay the control signal, and wherein the third number of delay elements is equal to the first number of delay elements plus a product of the first number of delay elements and the value of the ratio.

6. The method of claim 5, wherein the edge of the data signal occurs after the edge of the control signal relative to an edge of the clock signal.

7. The method of claim 1, wherein the value of the ratio is equal to 1/N, and wherein N is an integer.

8. The method of claim 1, wherein the second number of delay elements is less than the first number of delay elements.

9. The method of claim 1, wherein the third time delay corresponds to a time delay provided by a third number of delay elements that is less than the first number of delay elements.

10. The method of claim 1, wherein the third time delay corresponds to a time delay provided by a third number of delay elements that is greater than the first number of delay elements.

11. A method comprising:
  sending a control signal and a data signal from a memory device;
  determining a first time delay corresponding to targeted a portion of a period of the control signal; and
  delaying the control signal by an adjusted time delay to generate a delayed control signal to capture the data signal at a controller device coupled to the memory device, the adjusted time delay being a function of the first time delay and a product of a ratio and the first time delay, the ratio being equal to a second time delay divided by the first time delay, the second time delay corresponding to a timing difference between an edge of the data signal and an edge of the control signal.

12. The method of claim 11, wherein the first time delay is equal to one-fourth of the period of the control signal.

13. The method of claim 11, wherein the adjusted time delay is less than the first time delay.

14. The method of claim 11, wherein the adjusted time delay greater than the first time delay.

15. The method of claim 11, wherein the second time delay is less than the first time delay.

16. The method of claim 11, wherein delaying the control signal includes decreasing the adjusted time delay if the edge of the data signal occurs before the edge of the control signal relative to an edge of a clock signal used by the memory device.

17. The method of claim 16, wherein delaying the control signal includes increasing the adjusted time delay if the edge of the data signal occurs after the edge of the control signal relative to the edge of the clock signal.

18. An apparatus comprising:
  a first circuit to provide a first time delay corresponding to a targeted portion of a period of a clock signal;
  a second circuit coupled to the first circuit to calculate a ratio of a first number of delay elements associated with the first time delay to a second number of delay elements associated with a second time delay that corresponds to a timing difference between an edge of a data signal and an edge of a control signal; and
  a third circuit to select a third number of delay elements, based at least in part on a value of the ratio, to delay the control signal to generate a delayed control signal.

19. The apparatus of claim 18, wherein the first circuit includes a delay line having a plurality of delay elements, and wherein the first number of delay elements is a portion of the plurality of delay elements.

20. The apparatus of claim 19, wherein the first circuit includes delay locked loop unit, and wherein the delay line is part of the delay locked loop unit.

21. The apparatus of claim 18, wherein the third circuit is configured to select the third number of delay elements that is less than the first number of delay elements if the edge of the data signal occurs before the edge of the control signal relative to an edge of the clock signal.

22. The apparatus of claim 18, wherein the third circuit is configured to select the third number of delay elements that is greater than the first number of delay elements if the edge of the data signal occurs after the edge of the control signal relative to an edge of the clock signal.

23. A system comprising:
- a memory device to provide a control signal and a data signal; and
- a controller device including a first circuit to determine a first time delay corresponding to a targeted portion of a period of the control signal, and a second circuit to delay the control signal by an adjusted time delay to generate a delayed control signal to capture the data signal, the adjusted time delay being a function of the first time delay and a product of a ratio and the first time delay, the ratio being equal to a second time delay divided by the first time delay, and the second time delay corresponding to a timing difference between an edge of the control signal and an edge of the data signal.

24. The system of claim 23 further comprising a processor coupled to the controller device.

25. The system of claim 23, wherein the controller device includes a delay locked loop unit responsive to the control signal to generate a delayed control signal that is out-of-phase with the control signal by one-fourth of the period of the control signal.

26. The system of claim 25, wherein the second circuit is responsive to at least the delayed control signal to calculate the ratio.

* * * * *

UNITED STATES PATENT AND TRADEMARK OFFICE
CERTIFICATE OF CORRECTION

PATENT NO.       : 7,701,802 B2                                           Page 1 of 1
APPLICATION NO.  : 12/245473
DATED            : April 20, 2010
INVENTOR(S)      : Alain Vergnes et al.

It is certified that error appears in the above-identified patent and that said Letters Patent is hereby corrected as shown below:

On the title page, item (75), in "Inventors", in column 1, line 1-2, delete "Eric Matullk" and insert -- Eric Matulik --, therefor.

On the title page, item (75), in "Inventors", in column 1, line 2, delete "Meyreull" and insert -- Meyreuil --, therefor.

On Sheet 4 of 14, in Box 14, Figure 4, line 1, delete "DRR" and insert -- DDR --, therefor.

In column 1, line 14, before "dynamic" insert -- synchronous --.

In column 1, line 39, delete "bidirectional" and insert -- bi-directional --, therefor.

In column 3, line 30, after "invention" insert -- . --.

In column 4, line 13, delete "bidirectional" and insert -- bi-directional --, therefor.

In column 4, line 50, delete "period," and insert -- period), --, therefor.

In column 5, line 1, delete "$f_{input}$" and insert -- $F_{input}$ --, therefor.

In column 7, line 44, delete "$S_0S_1$" and insert -- $S_0, S_1$ --, therefor.

In column 10, line 12, delete "SRAM" and insert -- SDRAM --, therefor.

In column 10, line 13, delete "SRAM" and insert -- SDRAM --, therefor.

In column 10, line 30, delete "FIG. 1," and insert -- FIG. 11, --, therefor.

In column 11, line 33, delete ""1t"" and insert -- "1" --, therefor.

In column 14, line 4, delete "DQS(0" and insert -- DQS(0) --, therefor.

Signed and Sealed this

Eighth Day of June, 2010

David J. Kappos
*Director of the United States Patent and Trademark Office*